United States Patent
Floresca et al.

(10) Patent No.: US 11,328,895 B2
(45) Date of Patent: May 10, 2022

(54) PARTICLE BEAM FOCUSING

(71) Applicant: FEI Company, Hillsboro, OR (US)

(72) Inventors: Herman Carlo Floresca, Frisco, TX (US); Brian Tilley, Richardson, TX (US)

(73) Assignee: FEI Company, Hillsboro, OR (US)

( * ) Notice: Subject to any disclaimer, the term of this patent is extended or adjusted under 35 U.S.C. 154(b) by 0 days.

(21) Appl. No.: 17/100,113

(22) Filed: Nov. 20, 2020

(65) Prior Publication Data
US 2022/0028647 A1    Jan. 27, 2022

Related U.S. Application Data

(60) Provisional application No. 63/056,103, filed on Jul. 24, 2020.

(51) Int. Cl.
| | |
|---|---|
| *H01J 37/153* | (2006.01) |
| *H01J 37/244* | (2006.01) |
| *H01J 37/20* | (2006.01) |
| *H01J 37/28* | (2006.01) |

(52) U.S. Cl.
CPC ............ *H01J 37/153* (2013.01); *H01J 37/20* (2013.01); *H01J 37/244* (2013.01); *H01J 37/28* (2013.01); *H01J 2237/216* (2013.01); *H01J 2237/24564* (2013.01); *H01J 2237/24578* (2013.01)

(58) Field of Classification Search
CPC ........ H01J 37/153; H01J 37/20; H01J 37/244; H01J 37/28; H01J 2237/216; H01J 2237/24564; H01J 2237/24578
See application file for complete search history.

(56) References Cited

U.S. PATENT DOCUMENTS

| | | | | |
|---|---|---|---|---|
| 10,134,558 | B2 * | 11/2018 | Sohda | H01J 37/28 |
| 2005/0163517 | A1 * | 7/2005 | Suhara | G03F 7/70675 |
| | | | | 399/48 |
| 2006/0278826 | A1 * | 12/2006 | Roberts | H01J 37/28 |
| | | | | 250/310 |
| 2017/0294291 | A1 * | 10/2017 | Saleh | H01J 37/32825 |
| 2018/0286629 | A1 * | 10/2018 | Sakakibara | H01J 37/244 |
| 2019/0113470 | A1 * | 4/2019 | Mueller | G01N 23/2251 |
| 2019/0295807 | A1 * | 9/2019 | Ishikawa | H01J 37/14 |
| 2021/0125808 | A1 * | 4/2021 | Floresca | H01J 37/153 |
| 2021/0166911 | A1 * | 6/2021 | Matsumoto | H01J 37/28 |

* cited by examiner

*Primary Examiner* — David A Vanore
(74) *Attorney, Agent, or Firm* — Klarquist Sparkman, LLP

(57) ABSTRACT

Apparatus and methods are disclosed for particle beam focusing, suitable for use in sample preparation or test environments, including SEM-based nanoprobing platforms. With a particle beam incident on a sample surface, stage current is used as an indicator of spot size. By scanning or searching settings of a working distance control, a control value having maximum (or minimum) stage current is used to set the beam waist at the sample surface. Alternatively, minima (or maxima) of reflected current can be used. Stigmator controls can be adjusted similarly to reduce astigmatism. The scan of control settings can be performed concurrently with sweeping the beam across a region of interest on the sample. Curved sweep patterns can be used. Energy measurements can be used as an alternative to current measurement. Applications to a nanoprobing workflow are disclosed.

26 Claims, 11 Drawing Sheets

PARTICLE BEAM FOCUSING

CROSS-REFERENCE TO RELATED APPLICATIONS

This application claims the benefit of U.S. Provisional Application No. 63/056,103, filed on Jul. 24, 2020, which is incorporated herein by reference in its entirety.

FIELD

The disclosure pertains to focusing a particle beam, and applications including configuration of analytic equipment.

BACKGROUND

Use of a scanning electron microscope (SEM) for imaging and nanoprobing applications in the semiconductor industry requires a well-focused beam at a sample surface. Conventional focusing techniques rely on observation of an image by a trained operator. These techniques are subjective, difficult to automate, and rely on the presence of discernible edge features oriented in two or more directions on the sample surface. Such features may not always be present. Accordingly, there is a need for improved technologies to provide automated focusing of an SEM or other particle beam.

SUMMARY

In brief, the disclosed technologies provide focusing based on measuring absorbed or secondary current from a sample receiving a particle beam. A working distance or stigmator beam control can be scanned or searched to determine one or more extrema of the measured current. Based on the determined one or more extrema, a setting for the control can be determined and applied. The method can be applied iteratively over working distance, stigmator-X, and stigmator-Y controls, to obtain a tight beam spot at the sample surface. The beam focus and the sample can subsequently be translated to a target position relative to a nanoprobe array as preparation for nanoprobe operations on the sample surface.

In a first aspect, the disclosed technologies can be implemented as an apparatus having a particle beam source and one or more hardware processors with memory coupled thereto. The particle beam source is configured to direct a particle beam onto a surface of a sample, and has a control for working distance of the particle beam. In some examples, the one or more hardware processors are coupled to the particle beam source and are configured to execute instructions stored in the memory to scan the working distance control while measuring a current from the sample, and to focus the particle beam at the surface of the sample based on at least one magnitude of the measured current. In other examples, the working distance can be scanned while measuring of an energy. The measurements can be spatially unresolved measurements of current or energy at respective distinct settings of the working distance control. The magnitude can be at or near an extremum of the measured current profile or energy profile. The extremum can variously be a minimum (algebraic) value of current leaving the sample, a maximum (algebraic) value of current leaving the sample, a minimum magnitude of the measured current, a maximum magnitude of the measured current, a maximum or minimum of energy in a photon, phonon, or particle energy pathway resulting from incidence of the particle beam on the surface of the sample.

In some examples, the particle beam source can include an objective lens. The working distance can be a distance from the objective lens to a waist of the particle beam. The execution of the instructions can further cause the one or more hardware processors to identify a distance from an objective lens to the surface of the sample, based on the at least one extremum of the measured current. The focusing can be based on the identified distance. The measured current can be a stage current measured from a stage supporting the sample. Alternatively, the measured current can be a reflected current measured with a detector above the surface of the sample. The focusing can include setting the working distance control to bring a waist of the particle beam to the surface of the sample. The focusing can include adjusting the position of a stage supporting the sample, to bring the surface of the sample to a waist of the particle beam. The scanning can be performed as a sequence of discrete settings of the working distance control.

In certain examples, the apparatus can be incorporated within a scanning electron microscope (SEM) and the particle beam can be an electron beam. In other examples, the apparatus can be incorporated within a focused ion beam (FIB) machine and the particle beam can be an ion beam.

In another aspect, the disclosed technologies can be implemented as a method. A particle beam is directed onto a surface of a sample. A working distance of a particle beam is scanned while measuring a current from the sample. The particle beam is focused at the surface of the sample, based on at least one extremum of the measured current.

In some examples, a stigmator control can be scanned while measuring the current from the sample to obtain a stigmator scan current profile. The stigmator control can be set based on at least one extremum of the stigmator scan current profile. In further examples, the working distance scan can produce a working distance scan current profile, and the focusing can be performed by iterative tuning. In a first pass, the working distance can be set based on the working distance scan current profile, first and second stigmator controls can be scanned while measuring the current from the sample to obtain first and second stigmator scan current profiles respectively. The first and second stigmator controls can be set based on at least one extremum of the respective first and second stigmator scan current profiles. In a second pass, the working distance can be set based on another working distance scan current profile, and the first and second stigmator controls can be set based on respective additional stigmator scan current profiles.

In additional examples, the particle beam can be swept over the surface of the sample, concurrently with scanning the working distance. The scanning can include performing a sequence of measurements of the current, at respective values of the working distance. The scanning and sweeping can be synchronized, such that each of the measurements commences at a same position of the sweeping. The scanning and sweeping can be synchronized, such that each of the measurements has a duration exceeding a period of the sweeping. The sweeping can include stepping through a sequence of discrete positions on the surface of the sample. The sweeping can be performed in a plurality of circular arcs at respective radii with respect to an origin point on the surface of the sample. Alternatively, the sweeping can be performed in a spiral pattern over the surface of the sample.

In a further aspect, the disclosed technologies can be implemented as a method. A particle beam is focused by measuring current from a sample receiving the particle beam while adjusting one or more particle beam controls, including a given control. The sample position is adjusted. At least the given control is adjusted to set a waist of the particle beam at the adjusted position of the sample. A surface of the sample is imaged at the adjusted position, with the adjusted value of the given control.

In some examples, the adjusted position can be within a predetermined threshold of a target separation from a nanoprobe array.

The foregoing and other objects, features, and advantages of the technology will become more apparent from the following detailed description, which proceeds with reference to the accompanying figures.

DETAILED DESCRIPTION

Introduction

Figure 1:
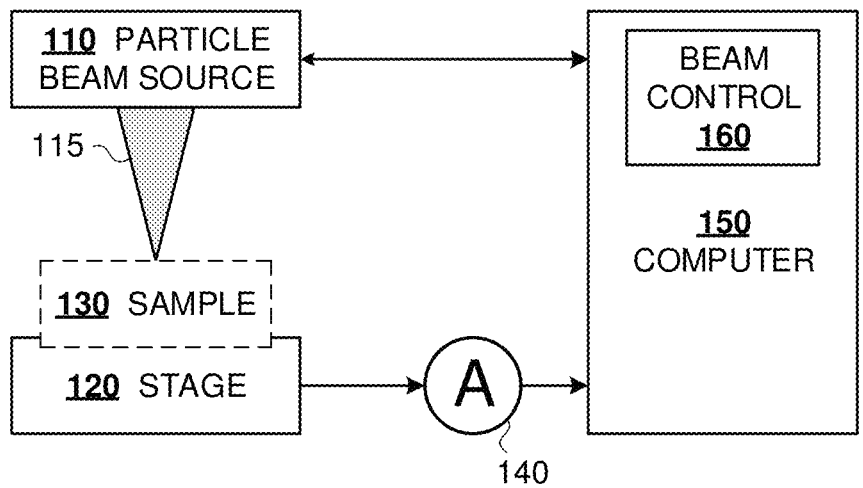
FIG. 1 is a diagram illustrating a first example apparatus suitable for practicing some examples of the disclosed technologies.

Many particle beam applications require accurate focusing at a sample surface. One approach has been to control the beam based on being able to obtain a sharp image, as determined by a human operator or based on an image quality metric. Such techniques are susceptible to high pixel noise at fast sweep or scan settings, and the discernible spatial contrast can vary based on sample features and magnification. Additionally, many local extrema can be encountered when searching a multi-dimensional parameter space (e.g. working distance and two stigmator controls). Furthermore, a particle beam machine can have multiple imaging detectors and choice of an imaging detector can be dependent on sample position. That is, one detector can be superior in one range of sample heights and inferior in another range of sample heights. Still further, the presence of dense, repeating, or directional patterns can confound automated image-based tuning. For example, astigmatism aligned with a directional pattern can be difficult to detect or correct.

Focusing methods face additional challenges in a nanoprobe environment, because the presence of nanoprobes proximate to the particle beam can distort the particle beam shape, rendering built-in beam calibration (e.g. for working distance) inaccurate, particularly for the high resolution requirements of semiconductor processes at 20 nm and below. Particularly, it can be desirable to perform beam focusing in the presence of the nanoprobe array.

The present technologies bypass imaging and built-in calibrations, relying instead on variation of measured current with beam spot size. The energy delivered to a sample by an incident beam can be distributed in different pathways: secondary emission and backscatter can carry away some energy, while other energy absorbed in the sample can manifest as stage current. Through charge conservation, particle beam current incident on a sample surface equals electrical current exiting the sample. Substantially all of this exiting current is either (a) stage current conducted out of the sample via a stage or other electrical wiring, or (b) reflected current, including both secondary emission and backscatter. To illustrate, in some instances −25 pA of a defocused beam incident on the sample can be distributed as −15 pA secondary/backscatter current, and −10 pA stage current out of the sample. At focus, the −25 pA incident beam current can be distributed as −20 pA secondary/backscatter current and −5 nA stage current out of the sample. Particularly, the distribution between stage current and reflected current can be dependent on the particle beam current density at the sample surface. As described herein, a higher magnitude of beam current density can result in a higher proportion of reflected current and a lower proportion of stage current. In the illustration above, the reflected current has a maximum magnitude and minimum (algebraic) value at focus, while the stage current has a minimum magnitude and (maximum) algebraic value at focus.

However, because of an interplay of different physical effects at the sample surface, the dependence of current distribution on beam focus can manifest in different ways in different operating regimes. As one example, the reflected current can sometimes exceed the incident particle beam current. Thus, under different beam or sample conditions, the −25 pA of the previous illustration can be distributed as −28 pA reflected current and +3 pA stage current. (Because the energy of reflected electrons can be significantly lower than a 100 eV to 10 keV range of incident electrons, such a situation can occur without violating energy conservation—some of the incident energy can be carried away by reflected electrons, some can be carried away as electrical energy of the stage current, and some can be converted to thermal or phonon excitation within the sample.) In another example, with reference to the defocused illustration above, the current distribution upon focusing can be distributed as −10 pA reflected current and −15 pA stage current. That is, in alternate configurations, a higher magnitude of beam current density (i.e. at or near focus) can result in a lower proportion of reflected current and a higher proportion of stage current. Such configurations can arise at beam energies of several keV.

Nevertheless, either stage current or reflected current can be used as a proxy for beam spot size, in a wide range of operating regimes. Accordingly, the present technologies utilize stage current measurements or reflected current measurements to adjust particle beam controls and determine an operating point having a tight beam spot with low astigmatism. Resolution below 10 nm is achievable in a reproducible, automated procedure, in the presence of nanoprobes, and independent of variations in surface patterns. The disclosed technologies provide new, robust techniques to obtain positional feedback along the axis of a particle beam column, and are applicable to electron beams and ion beams alike.

Still further, other measurements can be used as proxy for beam spot size. That is, the energy of an incident particle beam can be distributed through various pathways, any one or more of which can serve as an indicator of beam spot size. Certain pathways correspond to a flux of energy (e.g. carried by charged particles, photons, or neutral atoms or molecules) outside the sample, away from the sample surface, and can be dubbed "reflected energy." Other pathways correspond to energy from the incident particle beam that is retained within the sample (e.g. phonon excitation, heating, or lattice damage) and can be dubbed "absorbed energy". In varying examples, a magnitude of a phonon excitation, a magnitude of photon emission, or a flux of secondary particles can be measured. Such energy measurements can be made by any of a variety of known measuring techniques including, without limitation, using an energy analyzer, a calorimeter, a CMOS sensor, a mass spectrometer, a photosensor, a scattering detector, a scintillator, or a thermometer. Any such measurement of an energy flux can be dubbed "measured energy." The descriptions herein regarding scanning, searching, and making current measurements can similarly be extended to energy measurements.

The disclosed methods can be applied at a single spot on the sample surface, or while sweeping the beam across the sample surface in a repeating pattern. In some disclosed examples, artifacts due to directional sample patterns can be mitigated by performing circular sweeps at varying radial distances from a reference point. Spiral patterns can also be used. Furthermore, the disclosed technologies do not require the presence of any discernible surface features and can accurately focus the beam on a blank surface.

Disclosed techniques utilize scans over sets of discrete values of one or more beam control parameters. In some examples, the scan of control parameters can be synchronized with the beam sweep across the sample surface, while in other examples the sweep can be free-running relative to the parameter scans.

Through experimentation, the disclosed techniques have been found to be robust. Surprisingly, stage current has not been found to be strongly dependent on feature density (sometimes denoted spatial frequency). Unexpectedly, the approaches work well even in the presence of signal loss, e.g. due to nanoprobes obstructing the beam. In some examples, the nanoprobes can be electrically grounded and disconnected from an instant sample. The techniques have been applied over a range of working distances, beam currents, sample types, and sweep patterns. The techniques are applicable to a range of conductive and semi-conducting materials, with or without beam sweeping, with or without synchronization between spatial sweeps and current measurements. Some data described herein was obtained in an SEM configuration with about 500 eV landing energy, however the techniques are not limited thereby. The disclosed techniques at higher or lower landing energies, e.g. in ranges 100-2000 eV, 200-1000 eV, or 400-600 eV. Other particle beams such as focused ion beams can also be used.

Where previous approaches to automated focus failed in the nanoprobing application, the disclosed technologies enable automation of focus and astigmatism correction, which is a requirement for automated nanoprobing workflow.

Terminology

The usage and meaning of all quoted terms in this section applies throughout this disclosure unless clearly indicated otherwise or repugnant to the context. The terminology below extends to related word forms.

The term "ammeter" refers to a measurement device that can measure electrical current. An ammeter can be embodied as a stand-alone device, as part of an electronics package, or even within a same integrated circuit package (e.g., system on a chip (SoC)) as a microprocessor or other computer processors. An electronic ammeter can include e.g., a resistor coupled to a voltage-sensing analog-to-digital converter (ADC), a current-sensing ADC, or another implementation. An ammeter can have multiple inputs which can be measured separately (e.g., a four-channel ammeter) or together (e.g., so-called wired-OR configuration). Accordingly, a group of distinct ammeters is also considered to be an ammeter.

The term "astigmatism" refers to the deviation from circularity of a beam cross-section. In simple examples, a non-circular beam cross-section can be characterized as an ellipse having a major axis ("a", longest distance across the beam), a minor axis ("b", shortest distance across the beam), and an orientation of the major axis relative to some reference direction such as an X axis. The eccentricity of the ellipse is $e=\sqrt{1-b^2/a^2}$. The astigmatism can be characterized by eccentricity and orientation, or other equivalent parameters. Astigmatism of a beam can vary with longitudinal position. Astigmatism can also manifest as distinct focal planes for two orthogonal orientations. To illustrate, a beam can have a circular waist 30 nm in diameter at a longitudinal position of Z=10 mm, a minimum X extent of 20 nm at Z=13 mm, and a minimum Y extent of 20 nm at Z=7 mm.

The term "beam" refers to a directional flow of particles or energy. Common beams of interest in this disclosure are particle beams, such as electron beams or ion beams. A beam can have finite extent transverse to its principal longitudinal direction of flow. A line joining the centroids of two or more transverse cross-sections of a beam is an "axis" of the beam. Some beams can be well-confined. Other beams can have tails, with transverse extent beyond the bulk of the beam's particles or energy. Accordingly, a beam or any cross-section of the beam can have a "boundary" which can be defined as a smallest perimeter or surface containing some fraction of the beam's particles or energy, such as 90%, 99%, 100%, or some other fraction. The dimensions of the beam (such as diameter, area) or related quantities such as eccentricity or astigmatism can be defined with respect to the boundary. A beam can have a uniform or non-uniform density distribution across its cross-section. Such a distribution is called a "pattern" of the beam. Some beams of interest can have or can be approximated by a Gaussian pattern. A peak value of the beam's current density is its "peak beam current density", or just "beam current density" for short. A beam can have a waist. A beam can have a shape, determined by parameters such as waist diameter, a longitudinal position of the waist, a degree of astigmatism, or an orientation of the astigmatism.

Terms such as "best," "lowest," "minimum," "optimize," or the like are used to indicate that a selection among a few or among many alternatives can be made, and such selections need not be better, lower, less, or otherwise preferable to other alternatives not considered.

The term "current" refers to electrical current associated with a charged particle beam. The current can be variously refer to the current carried by the beam itself, dubbed "beam current"; to body current of a sample upon which the beam is incident, as conducted through the sample to a stage supporting the sample, dubbed "body current" or "stage current"; or to reflected current arising from secondary emission or backscattered particles resulting from incidence of the beam on the sample, dubbed "reflected current." An ammeter coupled to a stage can often measure substantially all the body current. However, an ammeter coupled to one or more Faraday cups, wire probes, or other detectors positioned above the sample surface can often measure only a portion of the reflected current. In some examples, because of charge conservation, the body current and the reflected current sum to the beam current, however this is not a requirement. In other examples, a sample can collect charge over a finite time period of some operations described herein. In some examples, reflected current can be used as a proxy for body current, or vice versa. Other proxies for reflected current can also be used, for example pixel intensity obtained in an imaging system from detected secondary or backscattered particles. With suitable measurement circuitry, stage current or reflected current can be measured as a voltage or a conductance. Accordingly, "current from the sample" can be stage current or reflected current, and can be measured by measuring stage current, by measuring reflected current, or by measuring another proxy.

The term "dwell" refers to an operation of stopping or moving slowly at part of a scan or sweep relative to other parts of the scan or sweep. The term "dwell time" can refer to the amount of time to perform a portion of a scan, which can be a single current measurement at a particular scan point, or a portion of a sweep, e.g. at a particular location on a sample surface.

The term "focus" refers to a position in a beam at which an image has best resolution (which can be the same as the waist of the beam), or refers to a property of an image having been formed at the focus of a beam. In some examples, adjusting a working distance control can longitudinally position a beam waist at a sample surface, or can reduce the diameter of a beam spot at the sample surface. In further examples, adjusting one or more stigmator controls can reduce eccentricity or beam waist size at the sample surface. Reducing astigmatism can also decrease circumference of a beam cross-section.

The term "focused ion beam" (FIB) refers to a beam of ions whose focus can be controlled to, for example: focus at a spot on a surface, have a focused waist at another longitudinal coordinate, or scan over a scan pattern. A FIB can be used for analysis, deposition, or removal of material at the focus spot. Commonly, a FIB comprises positive elemental ions, such as Xe+ or Ga+, however these are not requirements. Ion beam species such as Ga+ can be sourced from e.g., a liquid metal ion source (LMIS), while other ion beam species such as Xe+ can be produced in a plasma. A FIB produced with a plasma source can be termed a plasma focused ion beam (PFIB). Commonly, a FIB can be directed onto a surface for an analysis, deposition, imaging, or removal procedure.

The term "imaging" refers to a process for obtaining a two-dimensional representation (dubbed an "image") of a parameter value over a surface of a sample. In some examples, the imaged parameter can be reflectivity of an incident particle beam (e.g. by SEM or FIB), but this is not a requirement, and visible light or other parameters can also be imaged. The imaged parameter can indicate features across the sample's surface, however this is not a requirement, and imaging can also be performed on a blank, feature-less surface or a portion thereof.

The term "iteration" refers to each of multiple times a given operation or sequence of operations is performed. A sequence of iterations is dubbed a "loop." Iterations can be classified as "identical" if parameters are left unchanged between iterations (identical iterations can be used, for example, to improve signal quality through averaging), "predetermined" if the parameter values over which operations are to be repeated are known before the first iteration is performed, or "guided" if a parameter value of a later iteration depends on a result of an earlier iteration. Predetermined iterations refer to iterations actually performed. A loop of predetermined iterations need not execute for all the predetermined parameter values, but can terminate or exit early if a termination condition is met. A loop of guided iterations can begin with one or more predetermined iterations as seed(s).

The terms "longitudinal" and "transverse" generally describe coordinates of the described examples. Longitudinal refers to a direction along an axis of a beam, an axis of a beam source, or an axis of an instrument. Positions along the longitudinal direction can be described as height (measured above a substrate), longitudinal coordinate, Z coordinate, working distance (the distance from an emitting aperture or plane of a beam source to the waist or focus of the beam), or simply longitudinal position. The term "transverse" refers to dimensions and positions in any plane perpendicular to a beam axis. X and Y can be used to denote coordinates in a transverse plane. In some instances, a sample position can be adjusted in a longitudinal direction, e.g. to bring a working surface of the sample close to a target plane or nanoprobe array. In other instances, the sample position can be adjusted in the transverse plane, e.g. to position a region of interest ("ROI") of the sample's working surface relative to a particle beam.

The term "measurement" refers to the act of obtaining a value of a physical quantity, particularly an electrical current, or the value thereby obtained. In some instances, a measurement can be distinguished from a "reading," which is a single digitized value representing the physical quantity. For example, multiple readings can be taken until a stable value (the measurement) is obtained; multiple readings can be averaged to obtain the measurement; or scaling or calibration can be applied to a reading to obtain a measurement. However, in other instances a measurement and a reading can be identical. Some disclosed embodiments utilize spatially unresolved measurements, such as current measured by an ammeter. In some examples, a spatially unresolved measurement can be acquired with a single discrete sensor, while in other examples a spatially unresolved measurement can be aggregated from a plurality of spatially diverse sensors, or integrated over a spatial region. Inasmuch as images are spatially resolved, an image is not a spatially unresolved measurement.

The term "nanoprobe" refers to an electrical probe suitable for investigating microelectronic devices with feature size under 1 µm and often under 100 nm. In some examples, nanoprobes can be deployed with SEM, FIB, or atomic force microscopy (AFM) systems to assist in registration between nanoprobe and substrate features. Nanoprobes can commonly be arranged in an array of two to eight nanoprobes. In some examples, a nanoprobe can have a tip radius of 5 to 35 nm, and a body diameter of about 100 to 500 µm. A nanoprobe can be coupled to instrumentation circuitry to provide stimulus or acquire response signals from a substrate under test. A nanoprobe coupled to an ammeter can be used to acquire beam intercept current profiles in some examples of the disclosed technologies.

The term "particle" refers to a distinct unsubdivided unit of a flow of matter. Particles of common interest in this disclosure include charged particles such as electrons or ions (such as Ga, Xe, or protons), however particles are not limited thereto.

The term "particle beam" refers to a beam comprising a directional flow of particles.

The term "profile" refers to a distribution of some quantity as a function of a scanned parameter. In common examples, the profiled quantity can be a sample current. In common examples, the scanned parameter can be a working distance control, a stigmator control, or another scanned beam control.

The term "sample" refers to a physical object that can subject to an analytic procedure with a beam or probe or other analytic equipment as described in this disclosure. Often, a sample can have a "major surface" exposed to the beam or probe, which is a surface of the substrate whose area is not substantially exceeded by any other surface of the substrate.

The term "scan" refers to a traversal of a control of a particle beam source. Examples of beam controls can include, without limitation, a working distance control or stigmator controls. Scannable beam controls can exclude deflection coils for positioning or sweeping a position at which the particle beam is incident on a sample. Common scans in this disclosure are one-parameter scans, in which one beam control is varied while other beam controls are held fixed. However, this is not a requirement, and in other examples two or more beam controls can be varied together or can be interleaved. Common scans can be accompanied by measurements such as of a stage current or reflected current. The measurements can be aggregated as a profile for an instant scan. Common scans can be made over a sequence of discrete values of an instant control, with the scan pausing for a dwell time at each value (dubbed a "scan point") while a corresponding measurement is made. However, this is not a requirement, and in other examples, measurements can be made during a continuous scan of a beam control. Whether a scan is continuous or discrete, the scan can be performed with uniform or variable speed, with uniform or variable step sizes between scan points. A scan can be monotonic, for example a scan of working distance having successively increasing values of the working distance, or not. A scan can be performed in one or more passes.

The term "scanning electron microscope" (SEM) refers to an instrument combining an electron beam with controls to scan the electron beam in one or more transverse directions to perform imaging or some other analytic function on a substrate. An SEM can be used as a stand-alone imaging instrument, or can be integrated with other analytic equipment, for example in a nanoprobe system.

The term "separation" refers to a distance between two objects measured along a predetermined direction or measured between predetermined points on the two objects.

The term "stage" refers to an apparatus to which a sample can be attached and having actuators for adjusting a position or orientation of the sample.

The term "spiral" refers to a planar curve revolving around a fixed point with monotonically varying radial distance from the fixed point as a function of azimuthal position. A spiral can revolve one or more times around the fixed point. Some spirals can originate or terminate at the fixed point, but this is not a requirement. Archimedean spirals, logarithmic spirals, or portions thereof, can be examples of spirals.

The term "stigmator" refers to an apparatus within a particle beam source that can control or vary the astigmatism of a particle beam emitted from the particle beam source. In examples, a stigmator can be implemented as a quadrupole, such as an electrostatic quadrupole (e.g. four wires) or a magnetostatic quadrupole (e.g. four magnetic coils). A stigmator control can vary an excitation signal that controls an amplitude of electric or magnetic fields produced by the stigmator and applied to the particle beam. In some examples, a single stigmator apparatus can have two controls labeled "stigmator X control" and "stigmator Y control" to control astigmatism in two orthogonal directions. In other examples, the stigmator X control and the stigmator Y control can drive independent stigmator apparatuses.

The term "sweep" refers to a spatial traversal. Common sweeps in this disclosure are two-dimensional sweeps over a region of interest on a sample surface. A sweep can be continuous, without pauses at discrete points on the sample surface, or discrete, for example pausing for a dwell time at each of a set of discrete, distinct points dubbed "sweep points". Whether a sweep is continuous or discrete, the sweep can be performed with uniform or variable speed (or step size between points). A sweep can be performed in one or more passes over a region of interest. A sweep can be periodic. In some examples, the period of a sweep can be shorter than the duration of a measurement at a scan point.

The terms "top," "bottom," "up," "down," "horizontal," "vertical," and the like are used for convenience, with respect to a common configuration in which a vertical particle beam is incident on a top surface of a sample is processed. One of ordinary skill will understand from this disclosure that a choice of actual orientation can be varied without departing from the scope of the disclosed technologies.

In the context of beams emitted from a source, the term "waist" refers to a longitudinal position at which the transverse cross-section of the emitted beam can fit inside a smaller circle than the transverse cross-section at any other longitudinal position. A beam waist can be characterized by a pattern, a diameter, or a cross-sectional area (sometimes dubbed "spot size"). In a beam having astigmatism, the waist can be similar to the circle of least confusion used in optics.

First Example Apparatus

FIG. 1 is a diagram illustrating a first example apparatus 100 suitable for practicing some examples of the disclosed technologies. Apparatus 100 can be analytic instrumentation for investigating a sample 130 and its attendant features or devices.

Particle beam source 110 can generate a beam 115 directed to a surface of sample 130 mounted on a stage 120. Sample 130 is generally not part of the apparatus 100, and accordingly is shown by a dashed outline. However, apparatus 100 can include a load lock, or other fixturing or handling devices (not shown) to assist in handling the sample 130 or controlling an environment in which investigations on sample 130 are carried out.

Particle beam source 110 can have one or more controls, such as a working distance control or stigmator controls, that can be operated by beam control module 160 of computer 150. Singly or collectively, these controls can shape the emitted particle beam 115. Computer 150 can execute instructions stored on computer-readable media to control the apparatus 100 or to perform other operations described herein. Particularly, computer 150 can control the working distance or astigmatism of beam 115, e.g., by causing suitable excitation of one or more focusing coils or one or more stigmators of beam source 110. Particle beam source 110 can include an objective lens, and the working distance can be a distance between the objective lens and a waist of the particle beam 115.

Responsive to incidence of beam 115 on sample 130, a portion of the incident beam current can be conducted out of sample 130, through stage 120, to be measured as stage current by ammeter 140 and recorded by computer 150. Computer 150 can analyze the measured current and suitably control beam source 110 responsive to the measured current or to a program being executed on computer 150. In examples, computer 150 can also control sweeping of beam 115 over the surface of sample 130, by operation of sweep controls within beam source 110 or by controlling actuators to translate stage 120. Computer 150 can have a bus or network connection to peripheral devices (e.g., printer, storage, display) or to other computers (not shown).

Apparatus 100 can be used for performing any of the methods disclosed herein. Particularly, apparatus 100 can be configured to scan a working distance control and measure stage current at a succession of scan points. Similar scans can be performed with other beam controls such as stigmator controls. Apparatus 100 can be configured to focus particle beam 115 at the surface of sample 130 based on at least one maximum of the measured current.

Numerous extensions or variations of apparatus 100 can be implemented within the scope of the disclosed technologies. In some examples, beam 115 can be an electron beam and apparatus 100 can incorporate a scanning electron microscope. In other examples, beam 115 can be an ion beam and apparatus 100 can be a focused ion beam tool.

Second Example Apparatus

Figure 2:
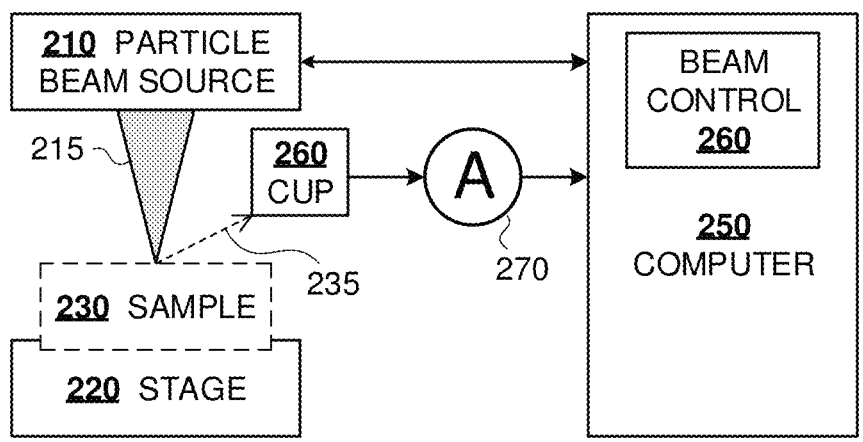
FIG. 2 illustrates a second example apparatus according to the disclosed technologies.

FIG. 2 is a diagram illustrating a second example apparatus 200. Controlled by computer 250, particle beam source 210 can generate a beam 215 directed to a surface of sample 230 (not part of the apparatus) mounted on a stage 220. Reflected current 235 can be collected by a Faraday cup 260 or another detector, measured by ammeter 270, and recorded by computer 250. The reflected current can include secondary emission or backscattered particles.

Through beam control module 260, computer 250 can operate a working distance control or stigmator controls of particle beam source 210 and can analyze readings of the reflected current received from ammeter 270. In examples, control of the beam 215 can be coordinated with the measurement of current, sweeping of beam 215 relative to the sample 230, or translation of stage 220, in accordance with a program executed on computer 250 or in response to instructions from a remote supervisory computer (not shown).

Numerous extensions or variations of apparatus 200 can be implemented within the scope of the disclosed technologies.

The apparatus of FIG. 2 can be used in the performance any of the disclosed methods. Apparatus 200 can be configured to scan a working distance control of beam source 210 while making measurements of reflected current, and focus particle beam 215 at the surface of sample 230 based on at least one minimum of the measured current.

Example Operating Principle

Figure 3:
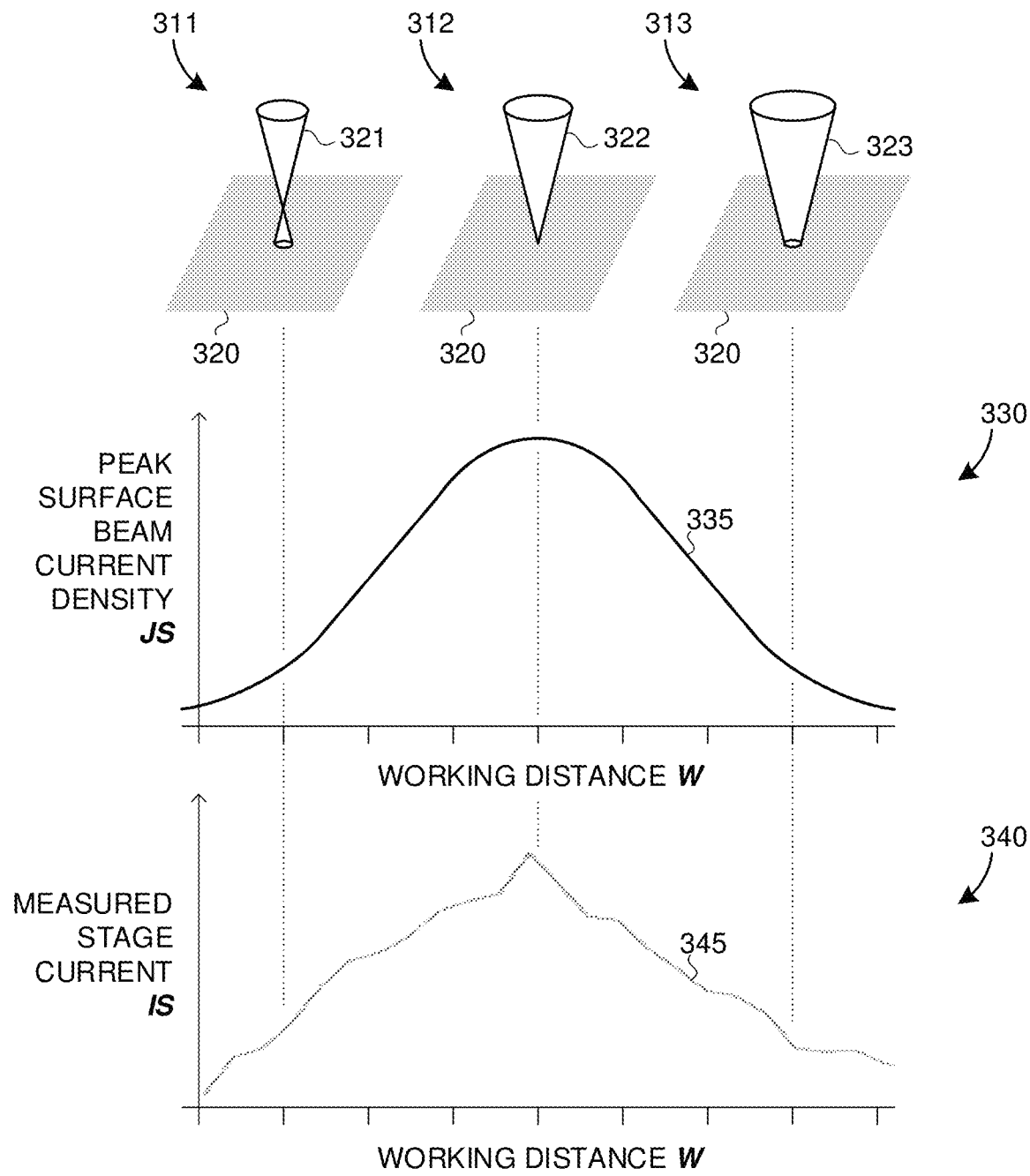
FIG. 3 is a diagram illustrating a principle of operation of the disclosed technologies.

FIG. 3 is a composite diagram 300 illustrating a principle of operation of the disclosed technologies. The diagram illustrates behavior of particle beam 321-323 and stage current 345 as working distance is scanned between a first position (inset 311) above sample surface 320 and a third position (inset 313) below sample surface 320.

As shown by beam 321 in inset 311, at the left of graphs 330, 340, the beam waist is above surface 320 and the working distance is less than the distance to the sample surface (e.g. from an objective lens of the beam source). Similarly, beam 322 in inset 312 illustrates how at the middle of graphs 330, 340, the beam waist is at the surface 320 and the working distance equals the distance to the sample surface. Finally, beam 323 in inset 313 illustrates that, at the right of graphs 330, 340, the beam waist is below surface 320 and the working distance is greater than the distance to the sample surface.

Graph 330 shows the variation in peak beam current density JS at the surface 320 as a function of working distance on the horizontal axis as a curve 335. Often, for a particle beam incident on a surface, beam current density is non-uniform and is greatest ("peak") at the center of the beam spot and decreases radially outward. Generally, for fixed total beam current, the peak beam current density JS is inversely correlated with spot size of the incident beam. That is, the peak beam current density 335 can be higher for a narrow beam spot than for a diffuse beam spot. The peak beam current density JS is plotted along the vertical axis of graph 330. The peak beam current density JS is observed to be maximum midway across the graph 330 where the waist of beam 322 is at the sample surface 320.

Graph 340 shows the corresponding variation in measured stage current IS 345 for the same span of working distance. Graphs 330, 340 demonstrate that the measured stage current 345 is correlated with the peak beam current density 335. That is, stage current 345 is maximum when the beam current density 335 is maximum. Accordingly, stage current 345 can be used as a proxy for the peak beam current density 335. Accordingly, by tuning on stage current 345, the beam waist and working distance can be set at the surface 320 to within a predefined tolerance. As described herein, incoming beam energy can be distributed among reflected current on one hand, and sample absorption (manifested as stage current) on the other hand. Because reflected current and stage current 345 sum to the total beam current, maximum stage current in graph 340 can also be a minimum in reflected current. Thus, in alternative embodiments, reflected energy or reflected current can be used for tuning beam controls, instead of stage current 345.

FIG. 3 illustrates a stage current distribution 345 having a single peak. However, in certain conditions (such as with astigmatic beams), two peaks can be observed as working distance is varied, which can correspond to distinct beam waists along two orthogonal axes of the astigmatism. In such cases, an average of the control settings for the two peaks can be used as an estimate of the control setting corresponding to a circular spot on the sample surface 320.

Thus, regardless of whether a current profile 345 has one extremum or two extrema, the profile of measured current 345 can be used to focus beam 322. A focusing procedure can use one or more maxima of stage current 345 (or alternatively, one or more minima of reflected current) to position the waist of beam 322 at the sample surface 320.

Similar effects can be observed with stigmator controls, with stage current distribution showing a single extremum as a function of a stigmator control setting. The stigmator control setting corresponding to this extremum can be used in a beam tuning procedure. By iterating a tuning procedure over multiple independent particle beam controls as described further herein, a tight circular spot at the sample surface can be obtained, with low astigmatism.

First Example Method for Focusing a Beam

Figure 4:
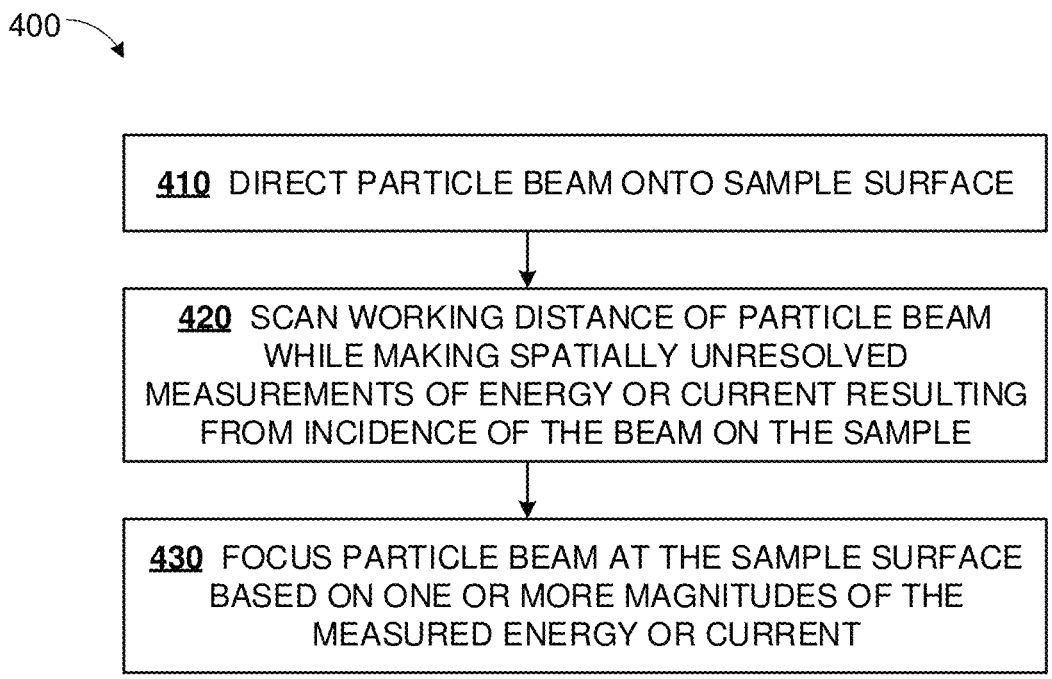
FIG. 4 is a flowchart of a first example method for focusing a beam according to the disclosed technologies.

FIG. 4 is a flowchart 400 of a first example method. In this method, a working distance scan is used to focus a beam at a particle surface.

At process block 410, a particle beam can be directed onto a sample surface. The particle beam can be similar to beams 115 or 215 emitted by a beam source similar to sources 110 or 210. At process block 420, the working distance of the particle beam can be scanned while measuring an energy or current resulting from incidence of the particle beam on the sample. A spatially unresolved measurement of energy or current can be made at each of a plurality of settings of the working distance. In some examples, the working distance can be scanned by varying a working distance control and changing the driving current to a focusing coil.

Based on one or more magnitudes of the energy or current, the particle beam can be focused at the sample surface at process block 430. The magnitude can be an extremum of a profile of the measured current, or can be within a predetermined amount (such as within 1% to 20%) of the extremum. The magnitude can be derived from the spatially unresolved sequence of measurements acquired at block 420. In some examples, the magnitude or extremum can be a measured extremum, while in other examples, the extremum can be determined by analysis of a series of current measurements. The measured current can be either stage current (in which case the current extrema can have maximum value in a first operating regime or minimum value in a second operating regime) measured from a stage supporting the sample, or reflected current (in which case the current extrema can have minimum magnitude in the first operating regime or maximum value in the second operating regime) measured with one or more detectors positioned above the surface of the sample.

Numerous extensions or variations of this method can be implemented within the scope of the disclosed technologies. In some examples, the extremum of the measured current can be identified with a working distance between an objective lens of a particle beam source and the sample surface, and focusing the beam can be accomplished by setting the working distance control to this identified working distance. To illustrate, a working distance scan profile can be obtained for scan points at working distance control settings 2, 3, 4, 5. By fitting the scan profile, the maximum stage current (or, minimum reflected current) can be determined to be at a control setting of 3.3. That is, the working distance to the sample can be associated with the control setting 3.3, and setting the working distance control to this value can result in focusing the particle beam at the sample surface. Focusing the beam can bring a waist of the beam to the sample surface. In alternative examples, the working distance can be set to a different value than the determined extremum, and focusing can be achieved by adjusting the position of a stage supporting the sample to bring the surface of the sample to the waist of the particle beam. In the illustration above, the working distance control can be set to 1 instead of 3.3, and focus can be achieved by translating the sample longitudinally by an equivalent of 3.3−1=2.3 working distance units.

In further examples, a stigmator control can be scanned while measuring the sample current, to obtain a stigmator scan current profile. The stigmator control can be set based on an extremum of the stigmator scan current profile. Scanning can be performed as a sequence of discrete settings of an instant beam control (e.g. stigmator control or working distance control).

Further extensions or variations are described in context of FIGS. 5-9 herein.

Second Example Method for Focusing a Beam

Figure 5:
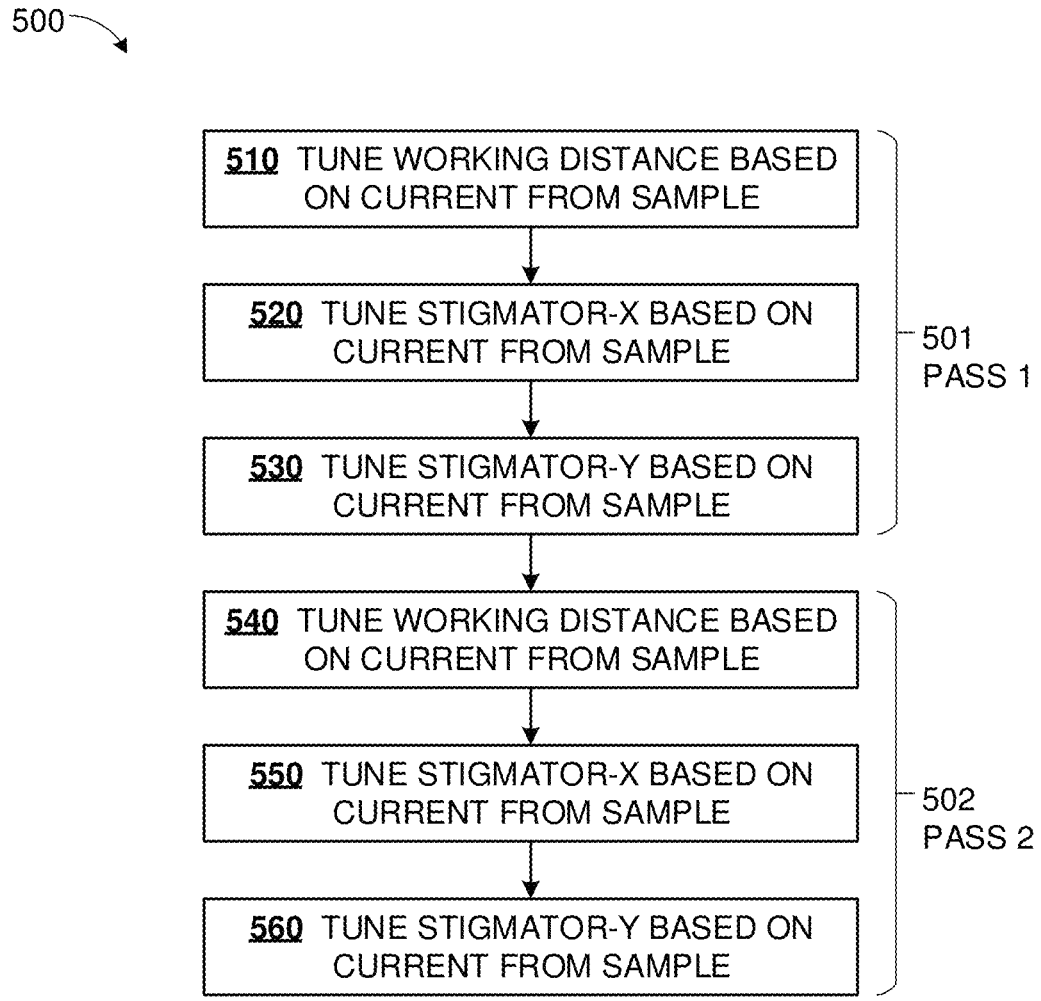
FIG. 5 is a flowchart of a second example method for focusing a beam according to the disclosed technologies.

FIG. 5 is a flowchart 500 of a second example method. In this method, beam controls are tuned in two or more iterations to focus a particle beam. Blocks 510-530 constitute a first pass 501, while blocks 540-560 constitute a second pass 502.

At process block 510, working distance can be tuned based on current from a sample. A working distance control can be set to a succession of scan points to scan the working distance. Current measurements during this scan can be collected to form a working distance scan current profile. The scan current profile can be used to adjust the working distance control and set the working distance. In examples, the working distance control can be set to a value corresponding to a maximum of a stage current profile (in cases where the measurements are measurements of stage current), to a value corresponding to a minimum of a reflected current profile (in cases where the measurements are measurements of reflected current), or to a value corresponding to an average of two extrema of the measured current (in cases where the working distance scan current profile exhibits two extrema).

At process block 520, a stigmator-X control (and associated astigmatism) can be tuned based on current from the sample. The stigmator-X control can be scanned and current measurements during this scan can be collected to form a stigmator-X scan current profile. The stigmator-X scan current profile can be used to adjust the stigmator-X control, which can reduce an astigmatism of the particle beam. In examples, the stigmator-X control can be set to a value corresponding to a maximum of a stage current profile (in cases where the measurements are measurements of stage current), or to a value corresponding to a minimum of a reflected current profile (in cases where the measurements are measurements of reflected current).

At process block 530, a stigmator-Y control (and associated astigmatism) can be tuned based on measurements of the current from the sample during a scan of the stigmator-Y control. The stigmator-Y control can be scanned and current measurements during this scan can be collected to form a stigmator-Y scan current profile. The stigmator-Y scan current profile can be used to adjust the stigmator-Y control, which can reduce an astigmatism of the particle beam. In examples, the stigmator-Y control can be set to a value corresponding to a maximum of a stage current profile (in cases where the measurements are measurements of stage current), or to a value corresponding to a minimum of a reflected current profile (in cases where the measurements are measurements of reflected current).

Thus in the first pass over blocks 510, 520, 530, the working distance, stigmator-X, and stigmator-Y controls can be successively tuned based on measured current from the sample. The measured current can be either stage current or reflected current. After tuning, each control can be set to its tuned value, so that the tuned value is used while tuning the next control. Variations of the first pass can be implemented. For example, the order in which blocks 510-530 are performed can be rearranged.

The second pass can include process blocks 540, 550, 560 and can be similar to the first pass. Successive scans of the working distance and stigmator controls can be used to acquire additional scan current profiles, and each control can be set based on its respective scan current profile. Each scan of blocks 540, 550, 560 can use tuned values of the other controls determined from the first pass or from a preceding scan in the second pass.

At block 540, the working distance control can be scanned and current measurements during this scan can be collected to form a second working distance scan current profile. The stigmator-X and stigmator-Y controls can be held constant during this scan at the most recent tuned values. In examples where the process blocks 540-560 are performed in the order illustrated, the working distance and stigmator-Y controls can be the tuned values determined at blocks 520, 530 respectively. In examples where the process blocks 540-560 are performed in another order, most recent tuned values from e.g. blocks 550 or 560 can be used.

At block 550, the stigmator-X control can be scanned and current measurements during this scan can be collected to form a second stigmator-X scan current profile. The working distance and stigmator-Y controls can be held constant during this scan at the most recent tuned values. In examples where the process blocks 540-560 are performed in the order illustrated, the working distance and stigmator-Y controls can be the tuned values determined at blocks 540, 530 respectively. In examples where the process blocks 540-560 are performed in another order, one or both of working distance and stigmator-X can be set to values previously determined from blocks 510, 560 respectively.

At block 560, the stigmator-Y control can be scanned and current measurements during this scan can be collected to form a second stigmator-Y scan current profile. The working distance and stigmator-X controls can be held constant during this scan at the most recent tuned values. In examples where the process blocks 540-560 are performed in the order illustrated, the working distance and stigmator-X controls can be the tuned values determined at blocks 540, 550 respectively. In examples where the process blocks 540-560 are performed in another order, one or both of working distance and stigmator-X can be set to values determined from blocks 510, 520 respectively.

Numerous extensions or variations of this method can be implemented within the scope of the disclosed technologies. For example, additional passes can be performed until a termination condition is satisfied. In some examples, the termination condition can be a predetermined number of passes, while in other examples, the termination condition can be a convergence criterion applied to one or more of the working distance control or the stigmator controls. In further examples, the termination condition can be a measurement of image sharpness under the tuned values of the controls. Additional iterations of pass 502 can provide progressively improved tuning, with a tighter beam spot, higher peak beam current density at the sample surface, or astigmatism below a threshold. Any of the blocks 510-560 can be performed using all or part of the method of FIG. 4.

Any of the scans described herein can be performed as a sequence of current measurements performed at a predetermined scan points. At a given scan point, one or more readings can be taken. In some examples, multiple readings can be taken to obtain an average of the multiple readings, which can be used as an instant measurement. In other examples, multiple readings can be taken until a reading converges to a stable value having a variation below a threshold, and the converged stable value can be used as the instant measurement. In some examples, the sequence of values can be predetermined, while in other examples, the sequence can be dynamically controlled e.g. by a binary search procedure. In some examples, the parameters of a given scan can be held constant over successive passes, while in other examples the parameters can be varied between passes. To illustrate, a first pass (e.g., block 510) can scan a working distance control over a range of settings from 10 to 100 μm with step size 5 μm, and thereby determine a tuned value of 62 μm. In some examples, the second pass (e.g. block 540) can use the same range of settings 10 to 100 μm or the same step size 5 μm while, in other examples, the second working distance scan (at block 540) can be tightened to a range of 40 to 80 μm, with step size 2 μm. The range of the second scan can encompass the tuned value from the first scan, or can be centered at the tuned value from the first scan.

Example Beam Sweeping

In examples, a scan of a beam control parameter can be performed concurrently with sweeping the particle beam relative to the sample surface. The sweep can be a predetermined pattern over a predetermined region of interest on the sample surface. The scanning and sweeping can be synchronized. In some examples, the time for a measurement at a scan point, a single reading at a scan point, or a total dwell time at a scan point can exceed the time period of the sweep. Each measurement or each reading at a scan point can commence at a same position of a sweep. In some examples, the sweep can be a rasterized sweep, while in other examples circular, spiral, or other curvilinear sweep patterns can be used. In varying examples, the sweep can be performed as a continuous sweep (e.g. in a spiral sweep pattern), as a piecewise continuous sweep (e.g. successive lines of a rasterized sweep, or successive circular arcs at distinct radii or azimuthal start positions relative to an origin point), or as a stepwise sweep over a sequence of discrete positions on the surface of an instant sample.

Sweeping can be accomplished by the use of steering controls at the particle beams source, or by translating a stage on which the sample is mounted, or by a combination of these actions.

While concurrent sweep and scan is a feature found in some common embodiments of the disclosed technologies, this feature is not a requirement. Any of the methods disclosed in context of FIGS. 5-9 can be implemented with scans performed on a stationary beam spot.

First Example Method for Setting a Beam Control Parameter

Figure 6:
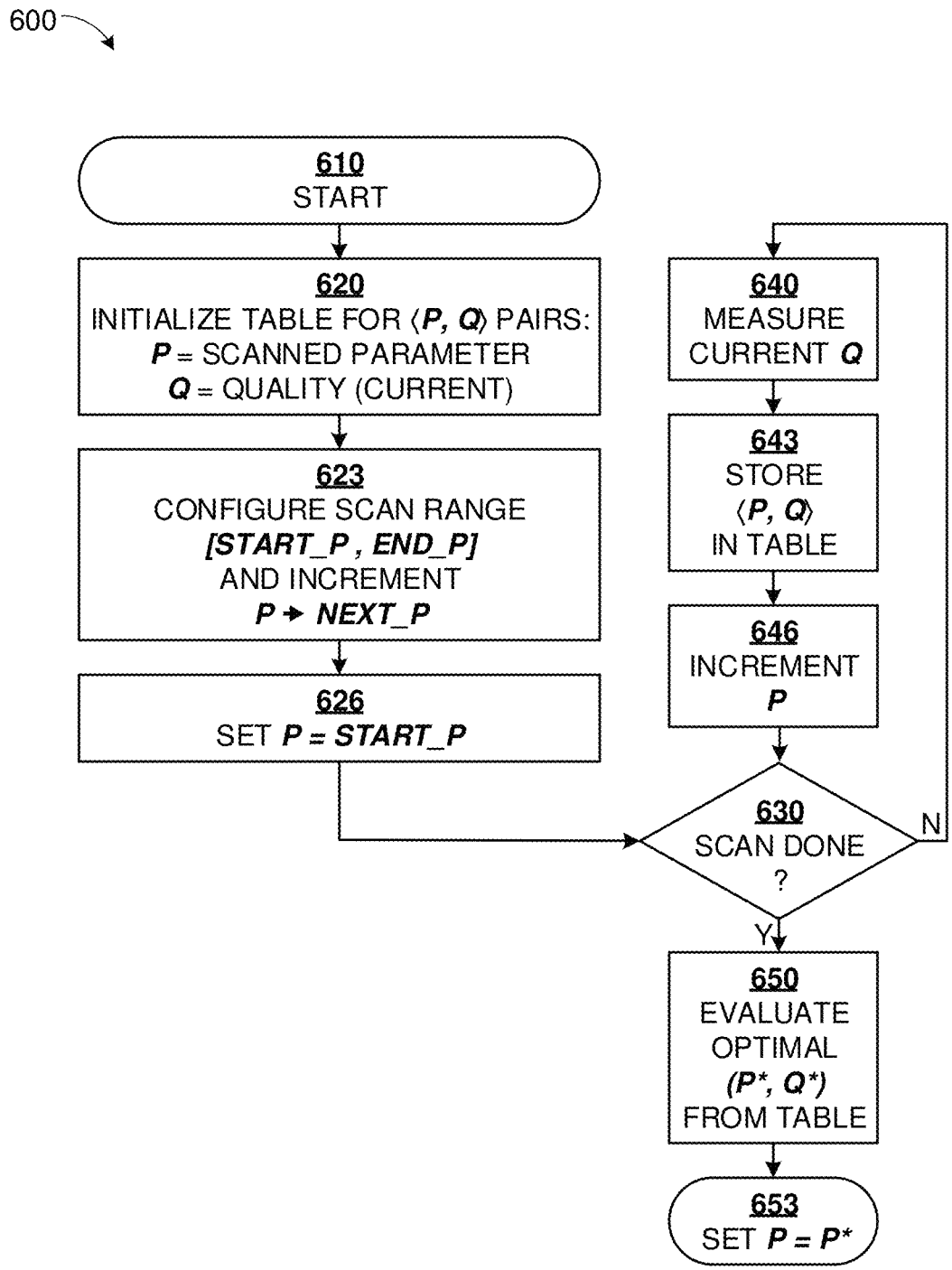
FIG. 6 is a flowchart of a first example method for setting a beam control parameter according to the disclosed technologies.

FIG. 6 is a flowchart 600 of a first example method for setting a beam control parameter, which can be applied to working distance, stigmator-X, or stigmator-Y. This method can be used for any one of the blocks 510-560 of FIG. 5. This method is based on a scan and evaluation of an extremum or optimum from a scanned series of measurement points. In examples, the measurement points can be fitted to a parabola, a Gaussian distribution, or another curve, to determine one or more extrema of the curve. If one extremum is found for a value P0 of the instant beam control parameter, then the beam control parameter can be set to P0. If two extrema P1, P2 are found, then the beam control parameter can be set to an average of P1, P2 in some examples, while in other examples, the beam control parameter can be set to P1, P2, or another intermediate value between P1 and P2.

The method commences at start block 610. At process block 620, a table is initialized for measurement pairs (P, Q), P representing a value of a scanned parameter at a given scan point (e.g. a setting of a working distance control or a stigmator control), and Q representing a measurement or quality indicator. In some examples, Q is a measurement of current from a sample, which can be a reflected current or a stage current as described in context of FIGS. 1-2. The table can be used subsequently to store (P, Q) pairs as measurements are made at successive scan points.

At block 623, a scan range can be configured. In examples, the scan range configuration can include setting a starting value START_P for the scanned parameter, a limiting value END_P for the second scanned parameter, and an increment to go from one P value to the next. To illustrate, START_P=1, END_P=10, and increment=+1 can configure a scan to successively apply parameter values 1, 2, 3, 4, . . . , 9, 10. Scan configuration can be implemented in numerous other ways. END_P can define a termination condition, and need not be a value that will actually be encountered during the scan. For example, END_P=10.2 would result in the same set of scan points as END_P=10. The increment can be additive, multiplicative, or a step in an index into a table of P values. The increment can correspond to a decrease of P, i.e. with START_P being greater than END_P.

At block 626, the scan is begun at a scan point P=START_P, from which the method proceeds to decision block 630 to test whether the scan is done, i.e. whether the configured scan has been completed or a termination condition has been met. If the scan is not done, then the method can follow the N branch from block 630 to block 640, where a current Q can be measured. At block 643, the instant P and Q values can be stored in the table initialized at block 620 and, at block 646, P can be incremented to the next scan point. Thus, the method returns to block 630, and can continue looping: collecting and storing (P, Q) pairs at respective scan points.

When the scan is done, the method can follow the Y branch from block 630 to block 650, where a value of P (denoted P*) having an optimal value of Q (commonly, an extremum, denoted Q*) can be determined from the stored table of (P, Q) values. In some examples, Q* can be the largest value of stage current stored in the table, while in other examples, P* can be determined analytically from the table of (P, Q) values, e.g. by fitting to a quadratic, polynomial, or Gaussian function. In further examples, P* can be determined without explicitly evaluating Q*. The method ends at block 653, where an output value of P is set equal to the optimal value P*. This output value of P can be used for focusing, or for setting the instant scanned parameter while performing a subsequent scan of another beam control parameter.

In short, blocks 610-626 configure a scan, which can collect measurements Q (current or another measure of beam quality) for successive values of an instant parameter P in a table. The scan range and step size are configured, and P is initialized. Blocks 640-646 perform one iteration of a measurement loop, and can be performed iteratively until the scan is complete at block 630 (e.g. P has been incremented past END_P). At block 650, the collected data is analyzed to find one or two extrema, and thus the optimal setting P. In the case of a single extremum, Q* at P* can be the fitted extremum current value. Then, output parameter P is set to P*.

Numerous extensions or variations of this method can be implemented within the scope of the disclosed technologies. For example, blocks 620-626 can be performed in a different order. As another example, the scan range can be configured with a termination condition (e.g. number of scan points, or a condition on the measured Q values) that is not a P value. In some examples, the termination condition evaluated at block 620 can be dependent on a series of Q measurements measured during the scan. For example, a sequential scan can be terminated when a target number of measurements has been obtained after an extremum has been reached. The target number can be 1, in a range 2-5, or in a range 6-10. The illustration above describes an example where the scanned parameter is varied in a monotonic sequence, however this is not a requirement. In other examples, other sequences (e.g. 1, 10, 2, 9, 3, 8, 4, 7, 5, 6; or 1, 4, 7, 10, 3, 6, 9, 2, 5, 8) can be used, or scan points can be arranged in arbitrary order or can be randomly selected from a predetermined set of scan points.

Second Example Method for Setting a Beam Control Parameter

Figure 7:
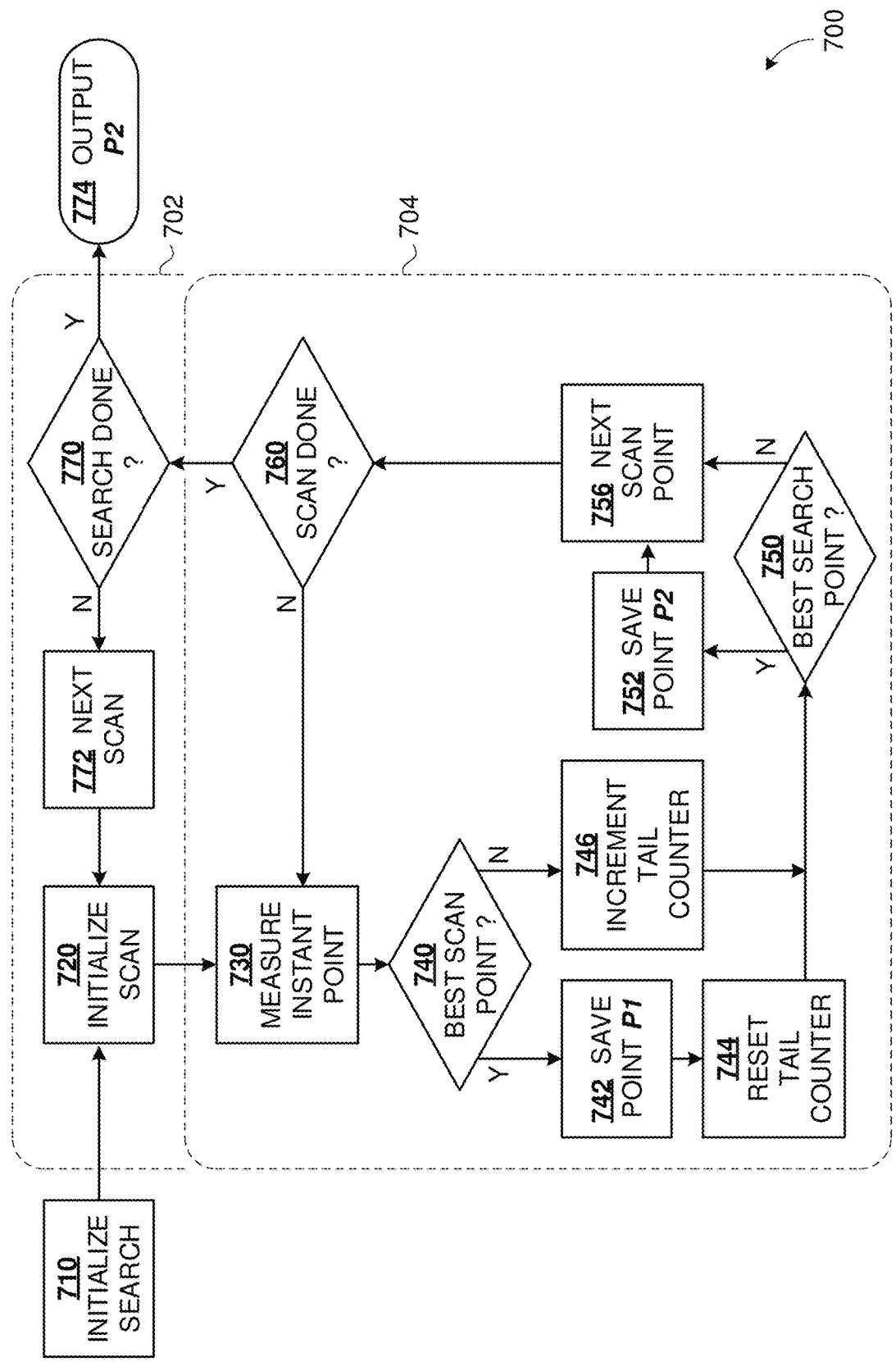
FIG. 7 is a flowchart of a second example method for setting a beam control parameter according to the disclosed technologies.

FIG. 7 is a flowchart 700 of a second example method for setting a beam control parameter, which can be applied to working distance, stigmator-X, or stigmator-Y. This method can be used for any one of the blocks 510-560 of FIG. 5. This method is based on a search which can converge at an extremum or optimum, through successive scans with progressively smaller step size and covering progressively smaller ranges of the beam control parameter. In examples with a bimodal current profile (i.e. two extrema), this method can be performed twice, once for each extremum. The method will be described in context of inner and outer loops in flowchart 700.

The method commences at block 710 where a search (outer loop 702) can be initialized. Search initialization can involve configuring: a parameter to be searched and scanned; initial scan parameters; a procedure for setting parameters of a next scan after an instant scan has been completed; or a termination condition specifying when the search (outer loop 702) can be terminated.

The method proceeds to block 720 where a scan (inner loop 704) can be initialized. Scan initialization can involve configuring: a parameter to be searched and scanned; initial scan parameters; a procedure for setting parameters of a next scan after an instant scan has been completed; or a termination condition specifying when the scan (inner loop 704) can be terminated.

Then, at process block 730, an iteration of inner loop 704 (one scan of the instant beam control parameter) commences with a measurement at the instant scan point (e.g. START_P on the first inner loop iteration), analogous to block 640 of FIG. 6. At decision block 740, the measurement is tested to determine if it is the best measurement yet (e.g. highest stage current) of the instant scan. If the instant measurement is better than the stored (e.g. previous best) value of P1, then the method can follow the Y branch from block 740 to block 742, where the instant scan point is saved as P1, and block 744, where a tail counter is reset. The tail counter can track the number of suboptimal scan points traversed after an update to P1. In some examples, the first iteration of inner loop 704 can follow the Y branch from block 740 and the "best" scan point P1 can be initialized to the first scan point of an instant scan. On subsequent iterations, the instant measurement may be inferior to the measurement at the best scan point P1, and the method can follow the N branch from block 740 to block 746, where the tail counter is incremented. To illustrate, the tail counter can be set to 1 on the first scan point after P1. A tail counter value of 5 can indicate that 5 scan points have been measured after P1.

Both blocks 744, 746 lead to decision block 750, where the instant measurement is tested against the best measured point over the entire search, i.e. during the instant scan and also any preceding scans of the instant search. Whereas best scan point P1 tracks the best measured scan point for an instant scan, the best search point P2 tracks the best measured scan point over all scans since the search commenced at block 710. If the instant measurement is better than the stored (e.g. previous best) value of P2, the method can follow the Y branch from block 750 to block 752, where the instant parameter value is saved as P2, and then to block 756. If the instant measurement is not the best, then the method can proceed via the N branch from decision block 750 directly to block 756.

At block 756, the instant scan is advanced to a next scan point, analogous to block 646 of FIG. 6, and at block 760 a termination condition can be tested to determine whether the instant scan is completed. In varying examples, a scan termination condition can be a range limit for the instant parameter (analogous to END_P of FIG. 6), a count of a number of scan points, a limit value on the tail counter (e.g. to stop the scan when the tail counter is greater than or equal to 8), or another condition related to one or more values measured at block 730. If the scan is not complete, the method follows the N branch from block 760 back to block 730 to measure the next scan point (set at block 756). That is, iterations of inner loop 704 can continue through blocks 730, 740, 750, 760, until the scan termination condition is met and the scan is deemed complete at block 760.

When the scan is done, the method can follow the Y branch from block 760 to block 770, where a search termination condition can be tested to determine whether the entire search procedure is done. In varying examples, the search termination can be based on: a number of scans; a parameter of the instant scan, such as scan step size below a first threshold, or scan range below a second threshold; convergence of the best points P1 or P2; or a condition on the best measurements corresponding to P1 or P2. If the search is not complete, the method can follow the N branch from block 770 to block 772 where the search advances to a next scan, and back to block 720 to initialize parameters (e.g. start, end, or increment values for the new scan; or reset of P1). That is, iterations of outer loop 702 can continue— through block 720, one or more iterations of inner loop 704, and block 770—until the search termination condition is met at block 770.

When the search is done, the method can proceed to block 774 for output of the best scan point of the search, namely P2.

In short, blocks 730-740-760 are corners of an inner "scan" loop 704 that scans parameter P and measures current (or another quality parameter) Q, to find an optimum at P=P1. Blocks 720-750-770 are corners of an outer "search" loop 702 that performs multiple scans of inner loop 704, to find an optimum at P=P2.

In inner loop 704, P1 tracks the best point of the current scan. P1 is reset for each scan at block 720. A tail counter is used to ensure that at least a threshold number of points is collected after passing an extremum. One scan termination condition (block 760) can be when the tail counter reaches a threshold value (say, 5, or another number from 1-10). At block 744, the tail counter can be reset to zero.

In outer loop 702, P2 tracks the best point found over all scans, and is initialized just once at block 710. A search can be terminated (block 770) when the improvement of P2 over successive scans is below a threshold. A next scan (blocks 772, 720 and inner loop 704) can be performed over a progressively shrinking window around the current value of P2, so as to more precisely locate the extremum, which is eventually output (block 774) when the search terminates.

Example Measurement Method

Figure 8:
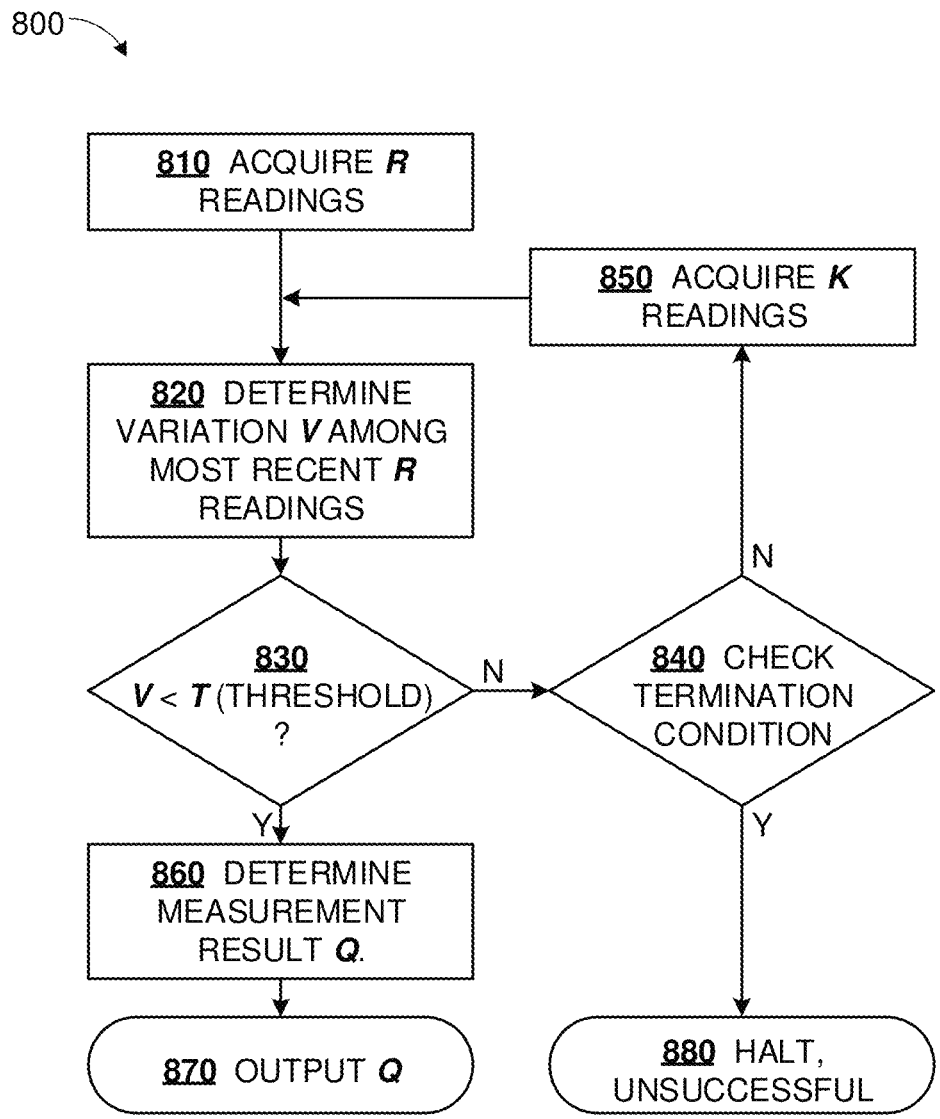
FIG. 8 is a flowchart of an example method for making a measurement according to the disclosed technologies.

FIG. 8 is a flowchart 800 of an example method for making a measurement. This method acquires successive measurements until the measurements settle.

The method commences at block 810, where R readings can be taken. At block 820, a variation V among the most recent R readings can be determined. In some examples, the variation can be simply the difference between the minimum and maximum of the R readings, while in other examples the standard deviation or another measure of variation can be used. At decision block 830, a determination can be made whether the variation V is less than or equal to a predetermined threshold T. If V exceeds the threshold T, the method can follow the N branch from block 830 to decision block 840 where a termination condition is checked. In varying examples, the termination condition can be: a check on total iterations of blocks 820, 830, or 850; a check on lack of convergence of V; or another termination criterion. If the termination condition has not been met, the method can follow the N branch from block 840 to block 850 where an additional K readings can be taken, prior to returning to block 820 to make another determination of variation V. However, if the termination condition is met at block 840, then the method can follow the Y branch from block 840 to block 880 where the methods halts, unsuccessfully. In varying embodiments, an unsuccessful halt can be accompanied by an alert to an operator console, or a logged entry indicating circumstances of the unsuccessful termination.

Alternatively, the method can determine at block 830 that V is within the threshold T and the method can follow the Y branch from block 830 to block 860, where a measurement result Q can be determined. In some examples, Q can be the mean of the most recent R readings, while in other examples Q can be a median or mode of the most recent R readings, or an extrapolation from successive groups of readings. Finally, at block 870, the method can output the measurement result Q and terminate successfully.

In short, readings can be acquired K at a time (block 850), until the most recent R readings have a variation V that is below a threshold T (blocks 820, 830). Then, the measurement result Q can be determined (e.g. average of the most recent M readings) and output (blocks 860, 870) for a successful termination of the method. Otherwise, if the readings are noisy or never settle, another termination condition (e.g. a timeout) can be used for an unsuccessful termination (blocks 840, 850). This method can be used to make the measurements of FIGS. 6-7 or block 420.

In varying examples, the value of R can be 2-5, 6-10, 11-20, or 21-50. In varying examples, the value of K can equal to R, less than R, or greater than R. For example, K can be set to about half of R, so that successive batches of readings evaluated at block 820 have about 50% overlap.

Example Method of Use

Figure 9:
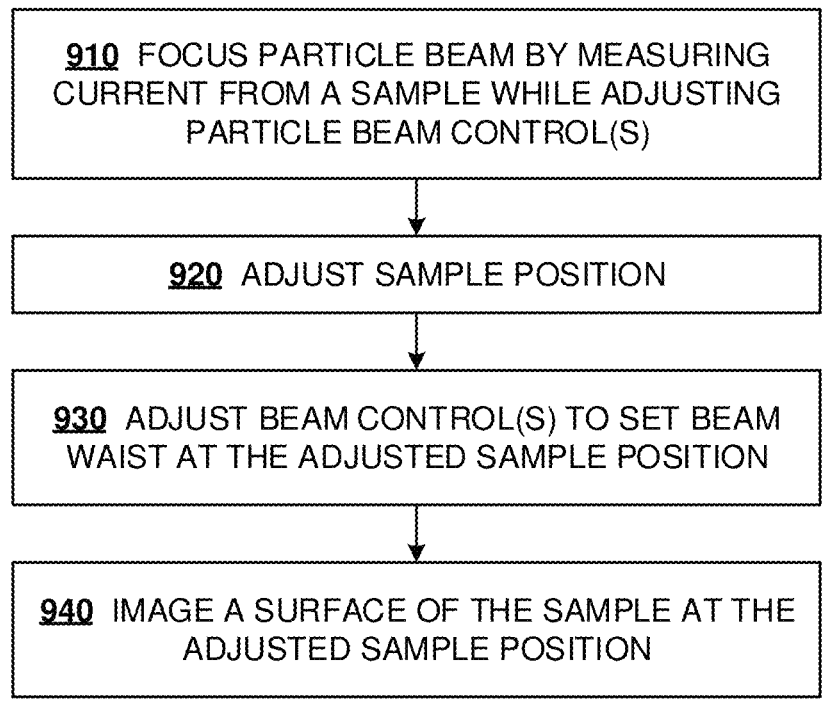
FIG. 9 is a flowchart of an example method for applying the disclosed technologies.

FIG. 9 is a flowchart 900 of an example method for applying the disclosed technologies. In this method, a current measurement technique is used to focus a particle beam on a sample at one vertical (longitudinal) position. The sample is translated to a second vertical position. The beam focus is adjusted for the translated sample, and an image of the sample surface is taken.

At block 910, the particle beam is focused based on: measuring current from a sample (stage current or reflected current) while adjusting one or more particle beam controls. This process block can be performed by using the methods of FIGS. 4-5, optionally including features described in context of FIGS. 6-8. Block 910 can establish a correspondence between a working distance control and a reading of a motor encoder on a translation stage, which can be advantageous when the sample thickness is unknown, when the motor encoder provides a relative rather than an absolute output signal, or when a working distance control of the particle beam exhibits nonlinearity, such as due to the presence of nanoprobes or other objects proximate to or within the particle beam.

At block 920, the sample can be translated (e.g. by a known vertical shift) to a target vertical position, within a predetermined tolerance. At block 930 one or more of the beam controls can be adjusted to set the beam waist at the position of the sample surface after translation. In some examples, this can be done by changing the beam working distance by the same amount (according to the machine calibration) as the known vertical shift of the sample. In other examples, further tuning of the beam can be performed similarly to block 910, or by using any portions of FIGS. 4-7. The controls adjusted at blocks 910 and 930 can include a common beam control.

Finally, at block 940, with the beam tuned for the adjusted sample position, the sample surface can be imaged using the particle beam.

The method of FIG. 9 can be applied according in different sample handling scenarios. In a first scenario, the sample can be loaded at an initial vertical position, commonly below a target sample position at which sample analysis or nanoprobing is desired to be performed. In this scenario, block 910 can be performed at the initial vertical position, block 920 can raise the sample directly to the target position, where blocks 930 and 940 can be performed. In some examples, the initial vertical position can be 50-100 µm, 100 µm-1 mm, or 1-5 mm below the target vertical position. The target vertical position can be 1-5 µm below tips of a nanoprobe array, with a tolerance of 0.1-0.2 µm, 0.2-0.5 µm, 0.5-1 µm, or 1-2 µm. To illustrate, in some examples the target position can be 2 µm below the nanoprobe array with a tolerance of 1 µm. One-sided tolerance windows can also be used, e.g. 0-3 µm below a nanoprobe plane.

In a second scenario, the sample can be lifted at block 920 to an intermediate stop position 5-20 µm, or about 10 µm, below the target position. In this scenario, block 910 can be performed at the initial vertical position, and blocks 930, 940 can be performed at the intermediate stop position. The sample lift at block 920 can be a coarse vertical adjustment and blocks 930, 940 can be used to refocus the beam or to verify beam focus before making a final position adjustment to the target height.

In a third scenario, block 910 can be performed at the intermediate stop position, block 920 can perform fine position control to the target position (e.g. near the nanoprobe tips), and blocks 930, 940 can be used to refocus the beam or to verify beam focus at the target height.

These scenarios illustrate how the method of FIG. 9 can be used to quickly and accurately find the sample position or set the sample to a target position. In turn, accurate and repeatable positioning permits the target position to be closer to a nanoprobe array than has previously been possible without a skilled operator. Finally, having the sample positioned close to the nanoprobe array results in less time required for landing nanoprobes on the sample surface using e.g. piezoelectric actuators. Additionally, by moving the piezoelectric actuators smaller distances in order to contact the sample, some undesirable effects can be minimized. Non-limiting examples of such effects include (A) piezoelectric creep, and B) beam distortion due to moving grounded probe(s).

These scenarios are illustrative. The disclosed technologies can also be used to accurately position a sample for other processing or analytic operations. The disclosed technologies can also be used to deliver a focused beam for high-resolution patterned operations on the sample, such as ion beam milling or electron beam lithography.

Example Microphotographs

Figure 10A:
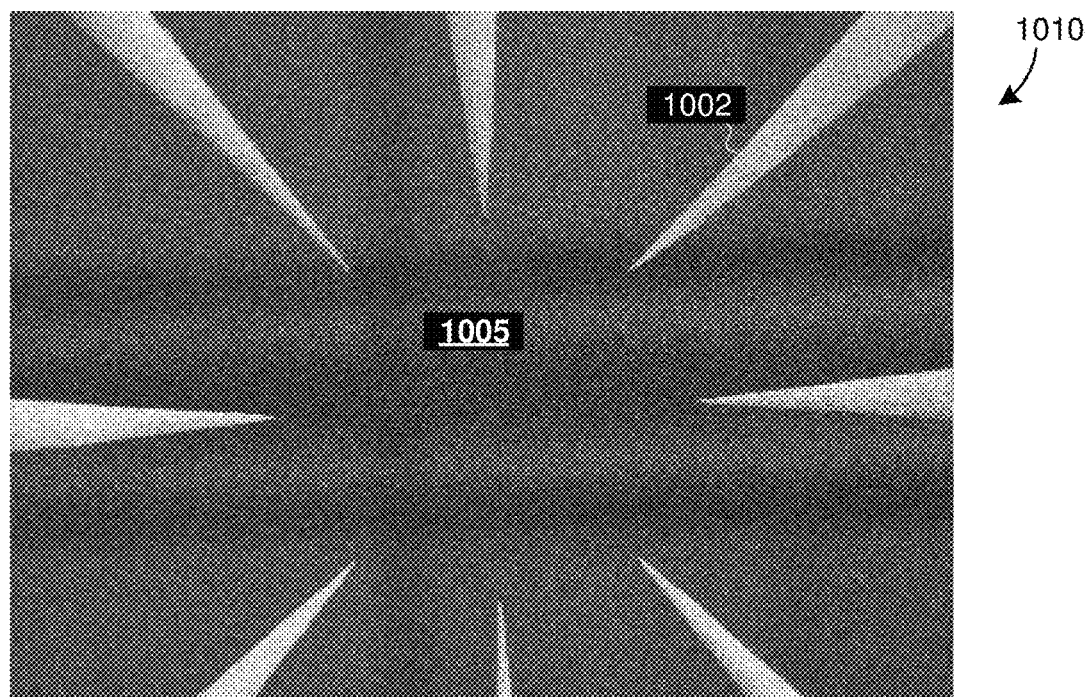
FIGS. 10A-10B are microphotographs illustrating performance of the disclosed technologies.
Figure 10B:
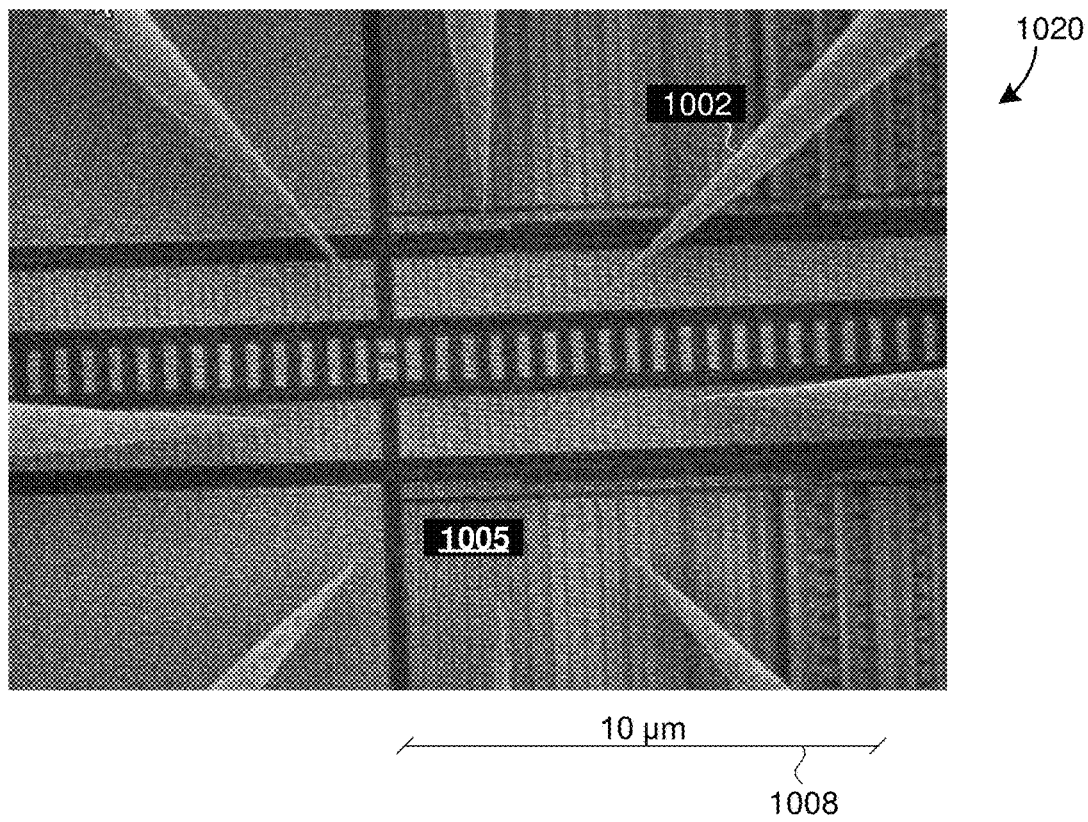

FIGS. 10A-10B are microphotographs 1010, 1020 illustrating performance of the disclosed technologies. FIG. 10A shows a sample surface 1005 about 50 µm below a nanoprobe array 1002. An imaging electron beam has been focused on the sample surface 1005 using the disclosed technologies, with the working distance then adjusted to be at about the height of nanoprobes 1002.

In FIG. 10B, the electron beam and nanoprobes are in the same configuration as FIG. 10A, however sample surface 1005 has been lifted to within 2-3 µm of the nanoprobe array 1002. The image of FIG. 10B shows the sample surface 1005 imaged with high resolution (better than 100 nm), indicating a sharp focus of the electron beam at sample surface 1005 at the desired height for nanoprobe testing, and demonstrating the efficacy of the disclosed technology for fully automated focusing and height adjustments.

The initial position, with sample surface 1005 about 50 µm below a nanoprobe array, is illustrative. Similar performance can be achieved for a range of initial positions, from 10-100 µm, 100-1000 µm, or even 1-2 mm.

Figure 11:
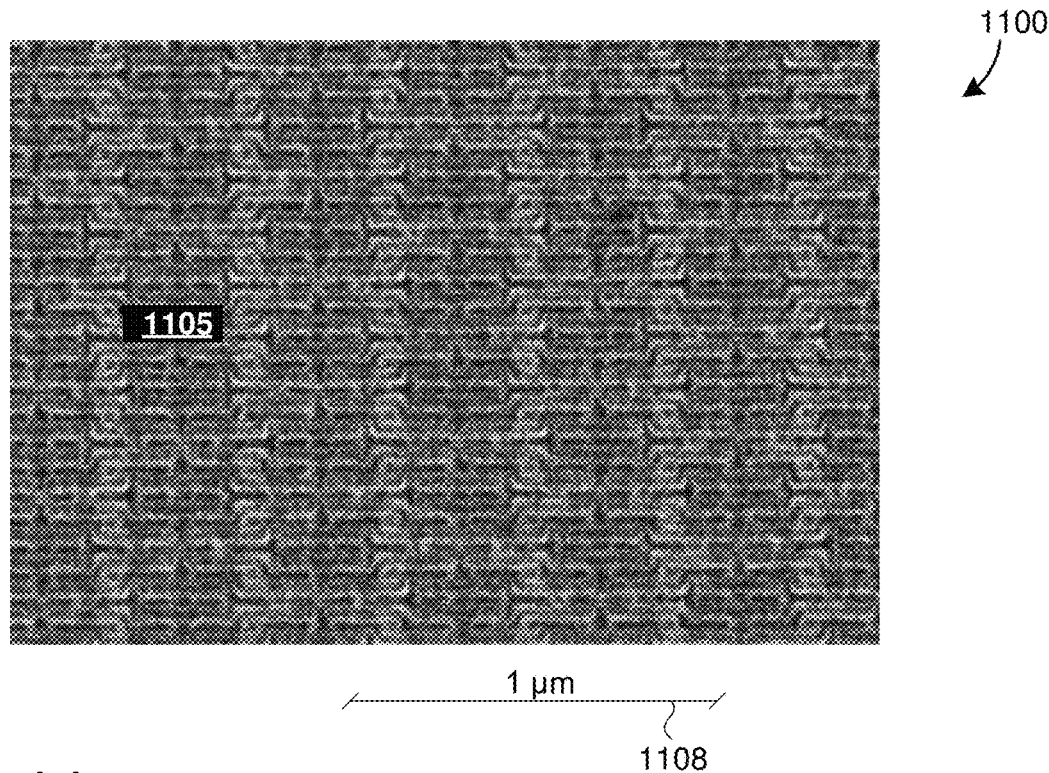
FIG. 11 is a microphotograph illustrating performance of the disclosed technologies.

FIG. 11 is another microphotograph 1100 illustrating performance of the disclosed technologies. Sample surface 1105 has been positioned at a target height after focusing according to the disclosed technologies. The device structures are clearly discernible with resolution better than 10 nm.

Figure 12:
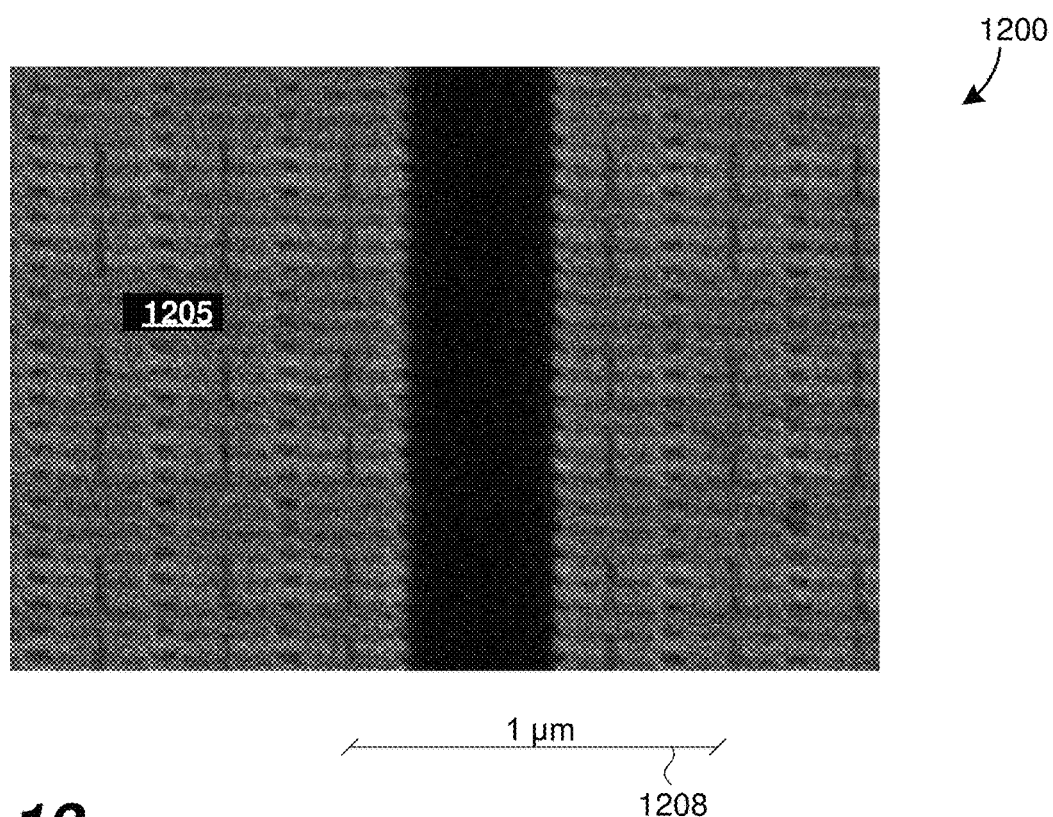
FIG. 12 is a comparative microphotograph.

FIG. 12 is a comparative microphotograph 1200 indicating the decreased image quality when the beam working distance is not correctly adjusted so that a beam focus or beam waist is at the sample surface.

A Generalized Computer Environment

Figure 13:
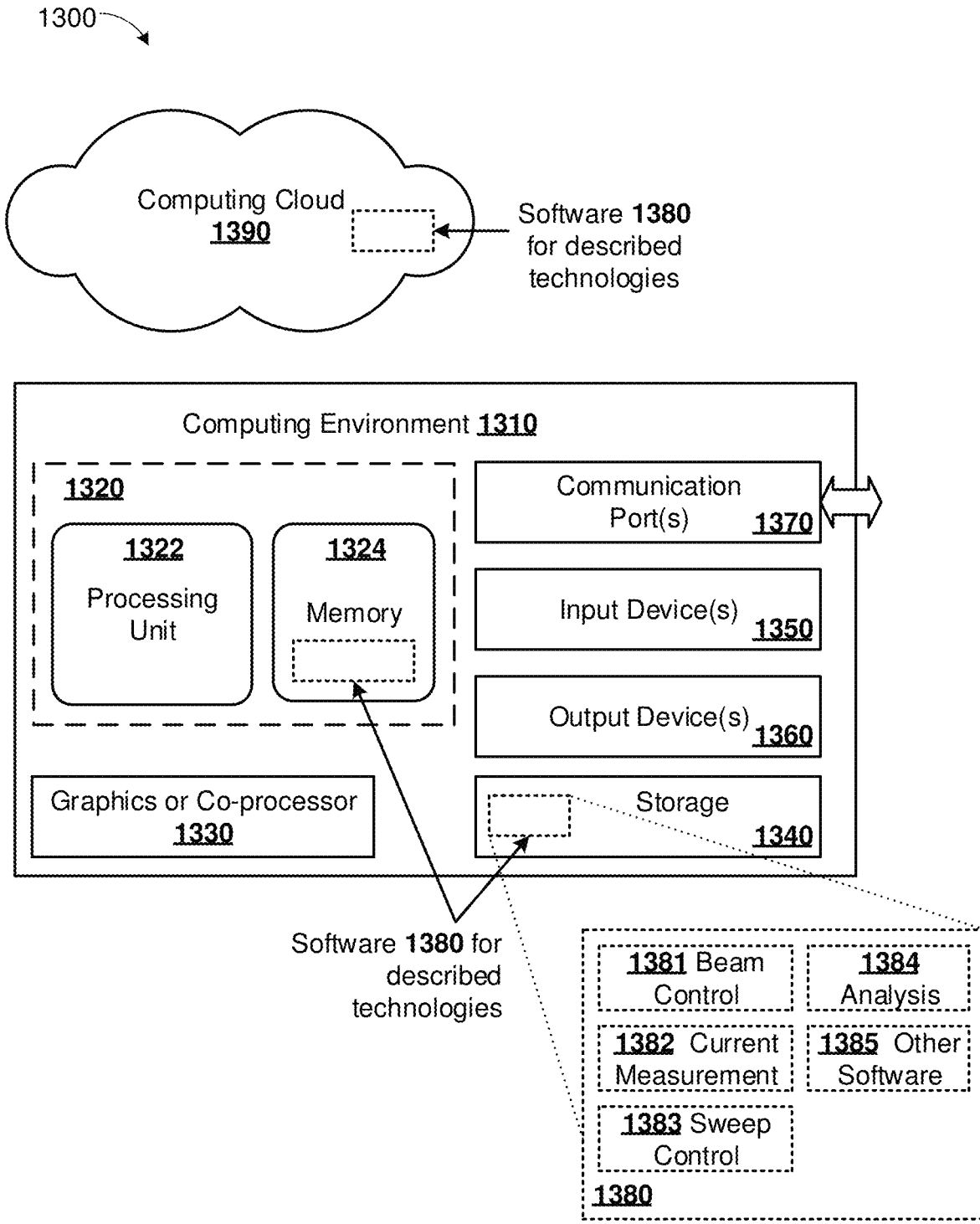
FIG. 13 illustrates a generalized example of a suitable computing environment in which described embodiments, techniques, and technologies pertaining to beam focusing can be implemented.

FIG. 13 illustrates a generalized example of a suitable computing system 1300 in which described examples, techniques, and technologies for configuring a particle beam machine, e.g. by focusing a beam at a sample surface or controlling beam astigmatism, can be implemented. The computing system 1300 is not intended to suggest any limitation as to scope of use or functionality of the present disclosure, as the innovations can be implemented in diverse general-purpose or special-purpose computing systems. The computing system 1300 can control or monitor an SEM-based nanoprobe platform, a sample preparation or analysis system, a particle beam microscope, or other particle beam based analytic equipment; or can acquire, process, output, or store measurement data.

With reference to FIG. 13, computing environment 1310 includes one or more processing units 1322 and memory 1324. In FIG. 13, this basic configuration 1320 is included within a dashed line. Processing unit 1322 can execute computer-executable instructions, such as for control or data acquisition as described herein. Processing unit 1322 can be a general-purpose central processing unit (CPU), a processor in an application-specific integrated circuit (ASIC), or any other type of processor. In a multi-processing system, multiple processing units execute computer-executable instructions to increase processing power. Computing environment 1310 can also include a graphics processing unit or co-processing unit 1330. Tangible memory 1324 can be volatile memory (e.g., registers, cache, or RAM), non-volatile memory (e.g., ROM, EEPROM, or flash memory), or some combination thereof, accessible by processing units 1322, 1330. The memory 1324 stores software 1380 implementing one or more innovations described herein, in the form of computer-executable instructions suitable for execution by the processing unit(s) 1322, 1330. For example, software 1380 can include software 1381 for controlling a particle beam (including control of working distance and stigmators), software 1382 for controlling current measurement, software 1383 for controlling beam sweep (including pattern, sweep speed, dwell time, and region of interest), software 1384 for performing analysis of measurement data, or other software 1385 (including control of a sample stage or control of nanoprobes). The inset shown for software 1380 in storage 1340 can be equally applicable to software 1380 elsewhere in FIG. 13. The memory 1324 can also store control parameters, calibration data, measurement data, or database data. The memory 1324 can also store configuration and operational data.

A computing system 1310 can have additional features, such as one or more of storage 1340, input devices 1350, output devices 1360, or communication ports 1370. An interconnection mechanism (not shown) such as a bus, controller, or network interconnects the components of the computing environment 1310. Typically, operating system software (not shown) provides an operating environment for other software executing in the computing environment 1310, and coordinates activities of the components of the computing environment 1310.

The tangible storage 1340 can be removable or non-removable, and includes magnetic disks, magnetic tapes or cassettes, CD-ROMs, DVDs, or any other medium which can be used to store information in a non-transitory way and which can be accessed within the computing environment 1310. The storage 1340 stores instructions of the software 1380 (including instructions and/or data) implementing one or more innovations described herein. Storage 1340 can also store image data, measurement data, reference data, calibration data, configuration data, sample data, or other databases or data structures described herein.

The input device(s) 1350 can be a mechanical, touch-sensing, or proximity-sensing input device such as a keyboard, mouse, pen, touchscreen, or trackball, a voice input device, a scanning device, or another device that provides input to the computing environment 1310. The output device(s) 1360 can be a display, printer, speaker, optical disk writer, or another device that provides output from the computing environment 1310. Input or output can also be communicated to/from a remote device over a network connection, via communication port(s) 1370.

The communication port(s) 1370 enable communication over a communication medium to another computing entity. The communication medium conveys information such as computer-executable instructions, audio or video input or output, or other data in a modulated data signal. A modulated data signal is a signal that has one or more of its characteristics set or changed in such a manner as to encode information in the signal. By way of example, and not limitation, communication media can use an electrical, optical, RF, acoustic, or other carrier.

A data acquisition system can be integrated into computing environment 1310, either as an input device 1350 or coupled to a communication port 1370, and can include analog-to-digital converters or connections to an instrumentation bus. An instrumentation control system can be integrated into computing environment 1310, either as an output device 1360 or coupled to a communication port 1370, and can include digital-to-analog converters, switches, or connections to an instrumentation bus.

In some examples, computer system 1300 can also include a computing cloud 1390 in which instructions implementing all or a portion of the disclosed technology are executed. Any combination of memory 1324, storage 1340, and computing cloud 1390 can be used to store software instructions and data of the disclosed technologies.

The present innovations can be described in the general context of computer-executable instructions, such as those included in program modules, being executed in a computing system on a target real or virtual processor. Generally, program modules or components include routines, programs, libraries, objects, classes, components, data structures, etc. that perform particular tasks or implement particular data types. The functionality of the program modules can be combined or split between program modules as desired in various embodiments. Computer-executable instructions for program modules can be executed within a local or distributed computing system.

The terms "computing system," "computing environment," and "computing device" are used interchangeably herein. Unless the context clearly indicates otherwise, neither term implies any limitation on a type of computing system, computing environment, or computing device. In general, a computing system, computing environment, or computing device can be local or distributed, and can include any combination of special-purpose hardware and/or general-purpose hardware and/or virtualized hardware, together with software implementing the functionality described herein.

General Considerations

As used in this application and in the claims, the singular forms "a," "an," and "the" include the plural forms unless the context clearly dictates otherwise. Additionally, the term "includes" means "comprises." Further, the term "coupled" does not exclude the presence of intermediate elements between the coupled items. Furthermore, as used herein, the terms "or" and "and/or" mean any one item or combination of items in the phrase.

The systems, methods, and apparatus described herein should not be construed as limiting in any way. Instead, the present disclosure is directed toward all novel and non-obvious features and aspects of the various disclosed embodiments, alone and in various combinations and sub-combinations with one another. The disclosed systems, methods, and apparatus are not limited to any specific aspect or feature or combinations thereof, nor do the disclosed systems, methods, and apparatus require that any one or more specific advantages be present or problems be solved. The technologies from any example can be combined with the technologies described in any one or more of the other examples. Any theories of operation are to facilitate explanation, but the disclosed systems, methods, and apparatus are not limited to such theories of operation.

Although the operations of some of the disclosed methods are described in a particular, sequential order for convenient presentation, it should be understood that this manner of description encompasses rearrangement, unless a particular ordering is required by specific language set forth below. For example, operations described sequentially may in some cases be rearranged or performed concurrently. Moreover, for the sake of simplicity, the attached figures may not show the various ways in which the disclosed systems, methods, and apparatus can be used in conjunction with other systems, methods, and apparatus. Additionally, the description sometimes uses terms like "produce" and "provide" to describe the disclosed methods. These terms are high-level abstractions of the actual operations that are performed. The actual operations that correspond to these terms will vary depending on the particular implementation and are readily discernible by one of ordinary skill in the art.

In some examples, values, procedures, or apparatus are referred to as "lowest", "best", "maximum," "optimum," "extremum," or the like. It will be appreciated that such descriptions are intended to indicate that a selection among a few or among many alternatives can be made, and such selections need not be lower, better, less, or otherwise preferable to other alternatives not considered. In particular, while the examples disclosed above generally adjust beam focus, working distance, or other parameters based on or at one or more extrema in measured current, this is not a requirement. In other examples, beam focus, working distance, or other parameters can be set to be detuned or offset from the extrema. For example, values can be selected within a full width at half maximum or full width at half minimum of the extrema, or within other ranges. If two extrema P1, P2 are found as discussed above, then a beam control parameter can be conveniently set to an average, or alternatively can be set to any combination of P1, P2 or one of P1 and P2.

Theories of operation, scientific principles, or other theoretical descriptions presented herein in reference to the apparatus or methods of this disclosure have been provided for the purposes of better understanding and are not intended to be limiting in scope. The apparatus and methods in the appended claims are not limited to those apparatus and methods that function in the manner described by such theories of operation.

Any of the disclosed methods can be controlled by, or implemented as, computer-executable instructions or a computer program product stored on one or more computer-readable storage media, such as tangible, non-transitory computer-readable storage media, and executed on a computing device (e.g., any available computing device, including tablets, smart phones, or other mobile devices that include computing hardware). Tangible computer-readable storage media are any available tangible media that can be accessed within a computing environment (e.g., one or more optical media discs such as DVD or CD, volatile memory components (such as DRAM or SRAM), or nonvolatile memory components (such as flash memory or hard drives)). By way of example, and with reference to FIG. 13, computer-readable storage media include memory 1324, and storage 1340. The terms computer-readable media or computer-readable storage media do not include signals and carrier waves. In addition, the terms computer-readable media or computer-readable storage media do not include communication ports (e.g., 1370).

Any of the computer-executable instructions for implementing the disclosed techniques as well as any data created and used during implementation of the disclosed embodiments can be stored on one or more computer-readable storage media. The computer-executable instructions can be part of, for example, a dedicated software application or a software application that is accessed or downloaded via a web browser or other software application (such as a remote computing application). Such software can be executed, for example, on a single local computer (e.g., any suitable commercially available computer) or in a network environment (e.g., via the Internet, a wide-area network, a local-area network, a client-server network, a cloud computing network, or other such network) using one or more network computers.

For clarity, only certain selected aspects of the software-based implementations are described. Other details that are well known in the art are omitted. For example, it should be understood that the disclosed technology is not limited to any specific computer language or program. For instance, the disclosed technology can be implemented by software written in Adobe Flash, C, C++, C#, Curl, Dart, Fortran, Java, JavaScript, Julia, Lisp, Matlab, Octave, Perl, Python, Qt, R, Ruby, SAS, SPSS, SQL, WebAssembly, any derivatives thereof, or any other suitable programming language, or, in some examples, markup languages such as HTML or XML, or with any combination of suitable languages, libraries, and packages. Likewise, the disclosed technology is not limited to any particular computer or type of hardware. Certain details of suitable computers and hardware are well known and need not be set forth in detail in this disclosure.

Furthermore, any of the software-based embodiments (comprising, for example, computer-executable instructions for causing a computer to perform any of the disclosed methods) can be uploaded, downloaded, side-loaded, or remotely accessed through a suitable communication means. Such suitable communication means include, for example, the Internet, the World Wide Web, an intranet, software applications, cable (including fiber optic cable), magnetic communications, electromagnetic communications (including RF, microwave, infrared, and optical communications), electronic communications, or other such communication means.

In view of the many possible embodiments to which the principles of the disclosed subject matter may be applied, it should be recognized that the illustrated embodiments are only preferred examples of the disclosed subject matter and should not be taken as limiting the scope of the claims. Rather, the scope of the claimed subject matter is defined by the following claims. We therefore claim all that comes within the scope and spirit of these claims.

We claim:

1. An apparatus comprising:
  a particle beam source configured to direct a particle beam onto a surface of a sample, the particle beam source having a control for shaping the particle beam;
  one or more hardware processors with memory coupled thereto, the one or more hardware processors further coupled to the particle beam source;
  wherein the memory stores instructions that, when executed by the one or more hardware processors, cause the one or more hardware processors to:
    scan the control while making spatially unresolved measurements of a current or energy derived from incidence of the particle beam on the surface of the sample; and focus the particle beam at the surface of the sample based on at least one magnitude of the measured current or energy.

2. The apparatus of claim 1, wherein the instructions further cause the one or more hardware processors to:
identify a distance from an objective lens to the surface of the sample based on the at least one magnitude of the measured current or energy; and
wherein the focusing the particle beam is based on the identified distance.

3. The apparatus of claim 1, wherein the current is measured and the measured current comprises a stage current measured from a stage supporting the sample.

4. The apparatus of claim 1, wherein the current is measured and the measured current comprises a reflected current measured with a detector above the surface of the sample.

5. The apparatus of claim 1, wherein the control is a working distance control.

6. The apparatus of claim 5, wherein the focusing comprises setting the working distance control to bring a waist of the particle beam to the surface of the sample.

7. The apparatus of claim 1, wherein the control is a stigmator control.

8. The apparatus of claim 7, wherein the focusing comprises setting the stigmator control to reduce a waist diameter of the particle beam.

9. The apparatus of claim 1, wherein the focusing comprises adjusting a position of a stage supporting the sample to bring the surface of the sample to a waist of the particle beam.

10. The apparatus of claim 1, wherein the scanning is performed as a sequence of discrete settings of the control.

11. The apparatus of claim 1, wherein the current is measured and the at least one magnitude comprises an extremum of the measured current.

12. The apparatus of claim 1, wherein the energy is measured and the at least one magnitude comprises an extremum of the measured energy.

13. A scanning electron microscope (SEM) comprising the apparatus of claim 1, wherein the particle beam is an electron beam.

14. A focused ion beam (FIB) machine comprising the apparatus of claim 1, wherein the particle beam is an ion beam.

15. A method comprising:
directing a particle beam onto a surface of a sample;
scanning a working distance of a particle beam while measuring a current from the sample; and
focusing the particle beam at the surface of the sample based on at least one extremum of the measured current.

16. The method of claim 15, further comprising:
scanning a stigmator control while measuring the current from the sample to obtain a stigmator scan current profile; and
setting the stigmator control based on at least one extremum of the stigmator scan current profile.

17. The method of claim 15, wherein the scanning the working distance produces a working distance scan current profile, and the focusing comprises iterative tuning by:
in a first pass:
setting the working distance based on the working distance scan current profile;
scanning a first stigmator control while measuring the current from the sample to obtain a first stigmator scan current profile;
setting the first stigmator control based on at least one extremum of the first stigmator scan current profile;
scanning a second stigmator control while measuring the current from the sample to obtain a second stigmator scan current profile; and
setting the second stigmator control based on at least one extremum of the second stigmator scan current profile; and
in a second pass subsequent to the first pass:
setting the working distance based on another working distance scan current profile; and
setting the first and second stigmator controls based on respective additional stigmator scan current profiles.

18. The method of claim 15, further comprising:
concurrently with the scanning, sweeping the particle beam over the surface of the sample.

19. The method of claim 18, wherein the scanning comprises performing a sequence of measurements of the current, at respective values of the working distance.

20. The method of claim 19, wherein the scanning and sweeping are synchronized, such that each of the measurements commences at a same position of the sweeping.

21. The method of claim 19, wherein the scanning and sweeping are synchronized, such that each of the measurements has a duration exceeding a period of the sweeping.

22. The method of claim 18, wherein the sweeping comprises stepping through a sequence of discrete positions on the surface of the sample.

23. The method of claim 18, wherein the sweeping is performed in a plurality of circular arcs at respective radii with respect to an origin point on the surface of the sample.

24. The method of claim 18, wherein the sweeping is performed in a spiral pattern over the surface of the sample.

25. A method, comprising:
focusing a particle beam by measuring current from a sample receiving the particle beam while adjusting at least a given control of the particle beam;
adjusting a position of the sample;
adjusting at least the given control to set a waist of the particle beam at the adjusted position of the sample; and
imaging a surface of the sample at the adjusted position.

26. The method of claim 25, wherein the adjusted position is within a predetermined threshold of a target separation from a nanoprobe array.

* * * * *